US012633353B2

(12) United States Patent
Prakash et al.

(10) Patent No.: US 12,633,353 B2
(45) Date of Patent: May 19, 2026

(54) NONVOLATILE MEMORY READ WITH SELECTIVE KICK VOLTAGE

(71) Applicant: Sandisk Technologies, Inc., Milpitas, CA (US)

(72) Inventors: Abhijith Prakash, Milpitas, CA (US); Qinghua Zhao, San Carlos, CA (US); Mohan Vamsi Dunga, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 157 days.

(21) Appl. No.: 18/641,466

(22) Filed: Apr. 22, 2024

(65) Prior Publication Data

US 2025/0329393 A1 Oct. 23, 2025

(51) Int. Cl.
| | |
|---|---|
| *G11C 16/26* | (2006.01) |
| *G11C 16/04* | (2006.01) |
| *G11C 16/08* | (2006.01) |
| *H10B 43/10* | (2023.01) |
| *H10B 43/27* | (2023.01) |
| *H10B 43/35* | (2023.01) |

(52) U.S. Cl.
CPC .......... *G11C 16/26* (2013.01); *G11C 16/0483* (2013.01); *G11C 16/08* (2013.01); *H10B 43/10* (2023.02); *H10B 43/27* (2023.02); *H10B 43/35* (2023.02)

(58) Field of Classification Search
CPC ..... G11C 16/26; G11C 16/0483; G11C 16/08; H10B 43/35; H10B 43/10; H10B 43/27

USPC ...................................................... 365/185.17
See application file for complete search history.

(56) References Cited

U.S. PATENT DOCUMENTS

| | | | | |
|---|---|---|---|---|
| 9,318,210 | B1 * | 4/2016 | Hart ....................... | G11C 16/26 |
| 10,726,920 | B2 * | 7/2020 | Yang .................. | G11C 16/0466 |
| 10,726,922 | B2 | 7/2020 | Yang et al. | |
| 11,049,571 | B2 | 6/2021 | Yanagidaira | |
| 11,139,018 | B1 * | 10/2021 | Zainuddin ................ | G11C 7/12 |
| 11,594,285 | B2 | 2/2023 | Hioka et al. | |
| 11,837,295 | B2 | 12/2023 | Kamata et al. | |
| 11,862,249 | B2 * | 1/2024 | Yang .................. | G11C 16/0483 |
| 2012/0120729 | A1 * | 5/2012 | Yuh ......................... | G11C 16/12 |
| | | | | 327/306 |
| 2013/0194872 | A1 * | 8/2013 | Sim ......................... | G11C 16/26 |
| | | | | 365/185.25 |
| 2014/0347951 | A1 * | 11/2014 | Kim ..................... | G11C 29/021 |
| | | | | 365/230.06 |

* cited by examiner

*Primary Examiner* — Alexander Sofocleous
*Assistant Examiner* — Duy H Luong
(74) *Attorney, Agent, or Firm* — Pearl Cohen Zedek Latzer Baratz LLP

(57) ABSTRACT

An apparatus includes control circuits configured to connect to a plurality of nonvolatile memory cells. The one or more control circuits are configured to apply read voltages on a plurality of word lines connected to the nonvolatile memory cells, ramp down from the read voltages to subsequent voltages such that voltage on a word line transitions through a voltage that is below a subsequent voltage by a negative kick voltage. The one or more control circuits are further configured to apply a first negative kick voltage to ramp down from a read voltage on a first word line and apply a second negative kick voltage to ramp down from the read voltage on a second word line.

19 Claims, 23 Drawing Sheets

BL ⎯ 414

435

484

441

438

| DL106 | | SGD0 |
| DL105 | | SGD1 |
| DL104 | | DWLD0 |
| DL103 | | DWLD1 |
| DL102 | | WLL95 |
| DL101 | | WLL94 |
| DL100 | | WLL93 |
| DL99 | | WLL92 |
| DL98 | | WLL91 |
| DL97 | | WLL90 |
| DL96 | | |

VSB2

404    432    434    406

DL71 ⎯ WLL65
DL70 ⎯ WLL64
DL69 ⎯ DWLM1
DL68 ⎯ WLL63
DL67 ⎯ WLL62

445

404    432    434    406

VSB1

DL38 ⎯ WLL33
DL37 ⎯ WLL32
DL36 ⎯ DWLM0
DL35 ⎯ WLL31
DL34 ⎯ WLL30

406    432    434    406

VSB0

DL5 ⎯ WLL1
DL4 ⎯ WLL0
DL3 ⎯ DWLS1
DL2 ⎯ DWLS0
DL1 ⎯ SGS1
DL0 ⎯ SGS0

SL

250

439

303

Vk = 0.4 volts — BLK3 — 1210

Vk = 0.8 volts — BLK2

Vk = 0.4 volts — BLK1

Vk = 0.0 volts — BLK0

1318

Edge Region 1320 — Central region 1326 — Edge Region 1321

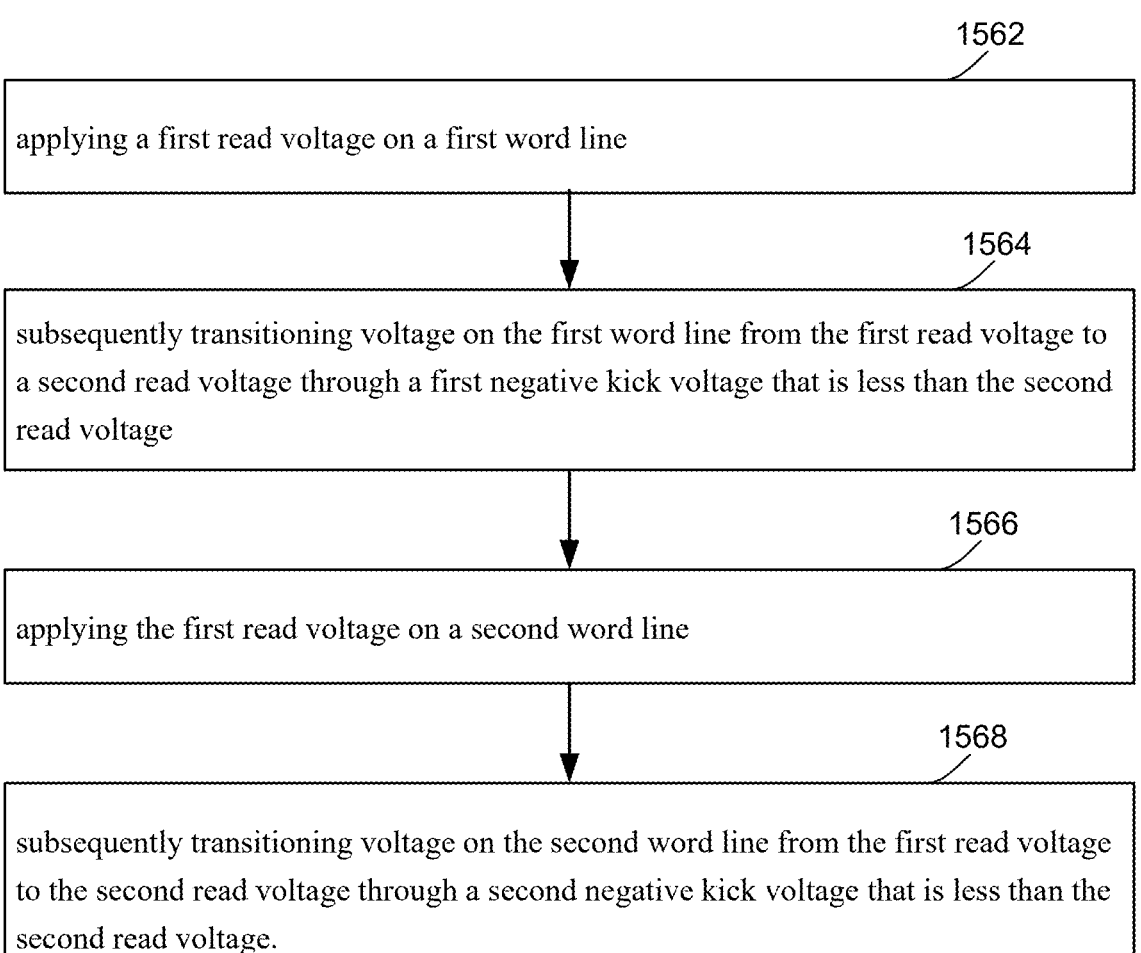

1562 applying a first read voltage on a first word line

1564 subsequently transitioning voltage on the first word line from the first read voltage to a second read voltage through a first negative kick voltage that is less than the second read voltage

1566 applying the first read voltage on a second word line

1568 subsequently transitioning voltage on the second word line from the first read voltage to the second read voltage through a second negative kick voltage that is less than the second read voltage.

Figure 16A

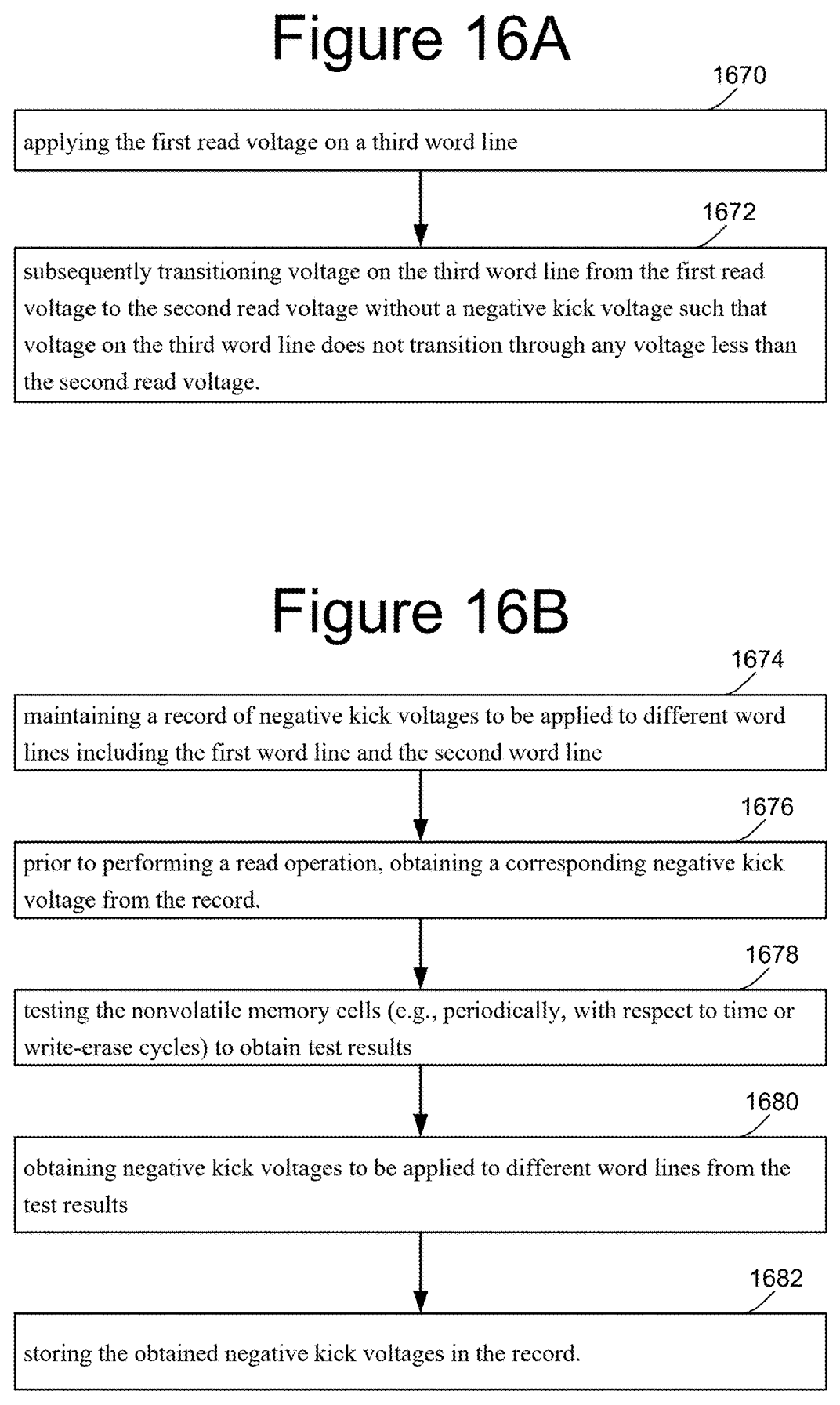

1670 applying the first read voltage on a third word line

1672 subsequently transitioning voltage on the third word line from the first read voltage to the second read voltage without a negative kick voltage such that voltage on the third word line does not transition through any voltage less than the second read voltage.

Figure 16B

1674 maintaining a record of negative kick voltages to be applied to different word lines including the first word line and the second word line

1676 prior to performing a read operation, obtaining a corresponding negative kick voltage from the record.

1678 testing the nonvolatile memory cells (e.g., periodically, with respect to time or write-erase cycles) to obtain test results

1680 obtaining negative kick voltages to be applied to different word lines from the test results

1682 storing the obtained negative kick voltages in the record.

Figure 16C

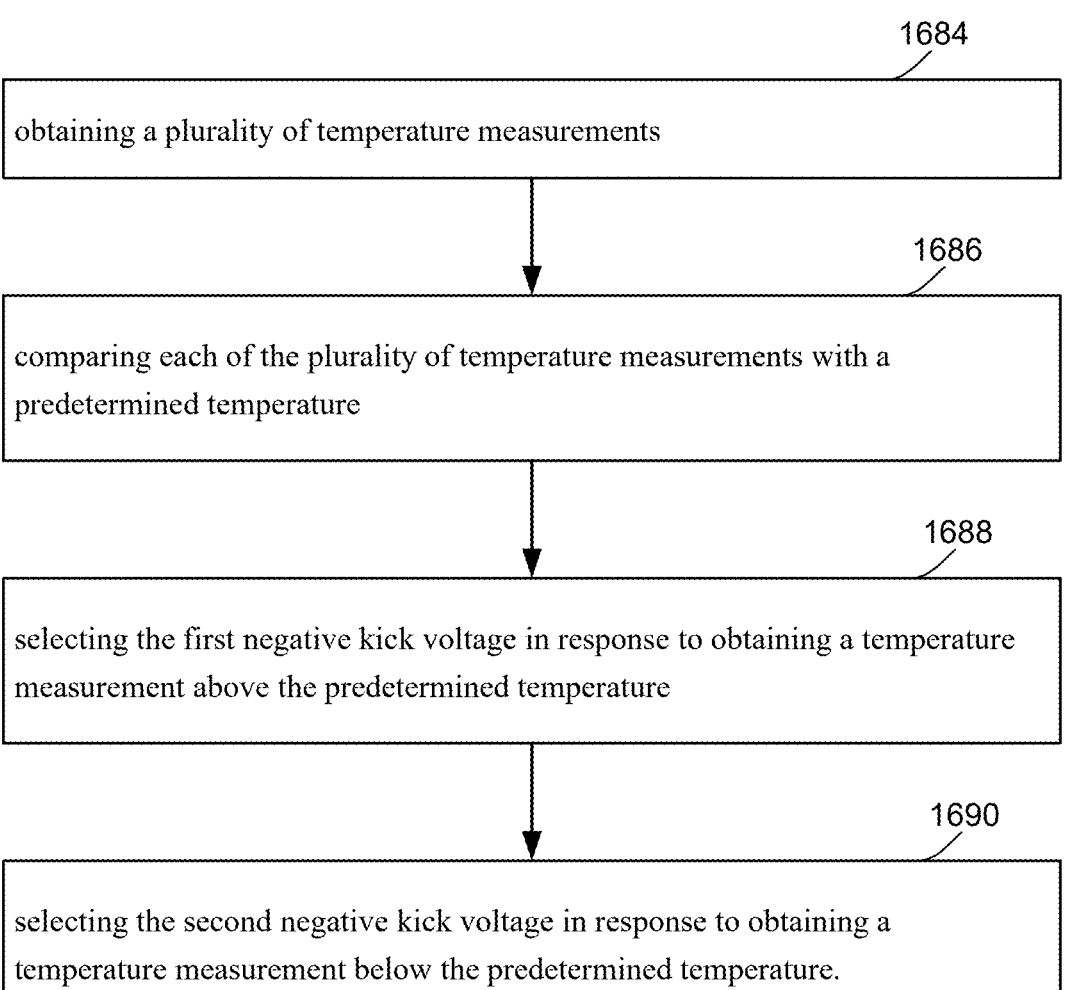

1684 obtaining a plurality of temperature measurements

1686 comparing each of the plurality of temperature measurements with a predetermined temperature

1688 selecting the first negative kick voltage in response to obtaining a temperature measurement above the predetermined temperature

1690 selecting the second negative kick voltage in response to obtaining a temperature measurement below the predetermined temperature.

NONVOLATILE MEMORY READ WITH SELECTIVE KICK VOLTAGE

BACKGROUND

The present technology relates to non-volatile memory and read operations for reading non-volatile memory cells.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. The cell may be read by detecting Vt, which may include applying different read voltages on a control gate of the memory cell to determine at what voltage the memory cell turns on/off. Reading memory cells efficiently and rapidly may be challenging. Furthermore, circuits to apply various voltages (including read voltages) may occupy significant area and efficient design of such circuits may be challenging.

BRIEF DESCRIPTION OF THE DRAWINGS

Like-numbered elements refer to common components in the different figures.

FIG. 15 shows an example of a method that includes applying different negative kick voltages.

FIGS. 16A-C show examples of methods of performing read operations.

DETAILED DESCRIPTION

Technology is disclosed herein for efficiently reading nonvolatile memory cells (e.g., memory cells storing more than one bit of data that are read by applying two or more different read voltages). In some examples, a voltage signal applied to a selected word line may include a voltage kick (e.g., between different read voltages). When a negative voltage kick is applied, voltage on the selected word line transitions from a previous read voltage to a lower voltage and then rises to a subsequent voltage that is above the lower voltage (e.g., by a negative kick voltage that may be controlled). In some examples of the present technology, negative kick voltages may be selectively applied (e.g., applied during certain read operations and not applied during other read operations) and/or different negative kick voltages may be applied (e.g., some read operations apply smaller negative kick voltages while other read operations apply larger negative kick voltages).

Aspects of the present technology provide solutions to technical problems of efficiently performing read operations using two or more read voltages and efficient design of word line control circuits that provide voltages for such read operations.

In an example, different negative kick voltages are applied when reading memory cells at different physical levels of a 3D memory structure. In some examples, different negative kick voltages are applied when reading memory cells in different blocks and/or at different locations in a block (e.g., center and edge areas). In some examples, different negative kick voltages are applied according to temperature.

In some cases, word line control circuits that apply voltages on word lines (e.g., read voltages) may have minimum physical dimensions that depend on voltage differences between components. Greater negative kick voltages may increase such voltage differences and result in larger dimensions than for smaller negative kick voltage (or no negative kick voltage). Selective application of negative kick voltages and/or applying different negative kick voltages on different word lines may allow at least some word line control circuits to be formed using reduced dimensions which may save die area.

Figure 1:
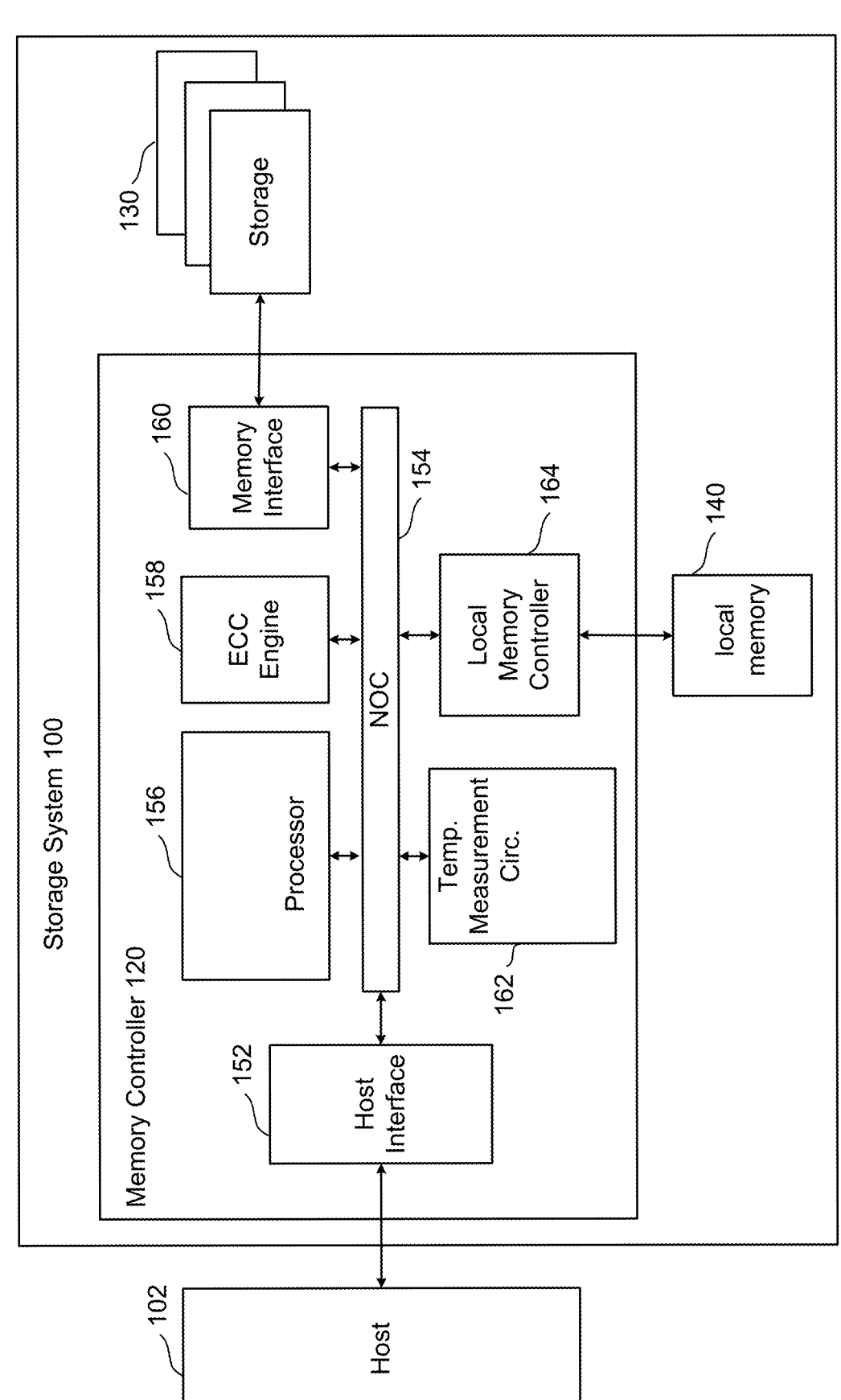
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus.

Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of memory controller 120) implements a scheduler and buffer for transmitting data to and receiving data from one or more memory die.

Temperature measurement circuit 162 includes temperature transducer 163 located in memory controller 120 (e.g., formed in a memory controller die). Temperature measurement circuit 162 may generate temperature measurement values from temperature sensing by transducer 163 (e.g., from measurement of a current, voltage, resistance or other metric or some combination of metrics).

Figure 2A:
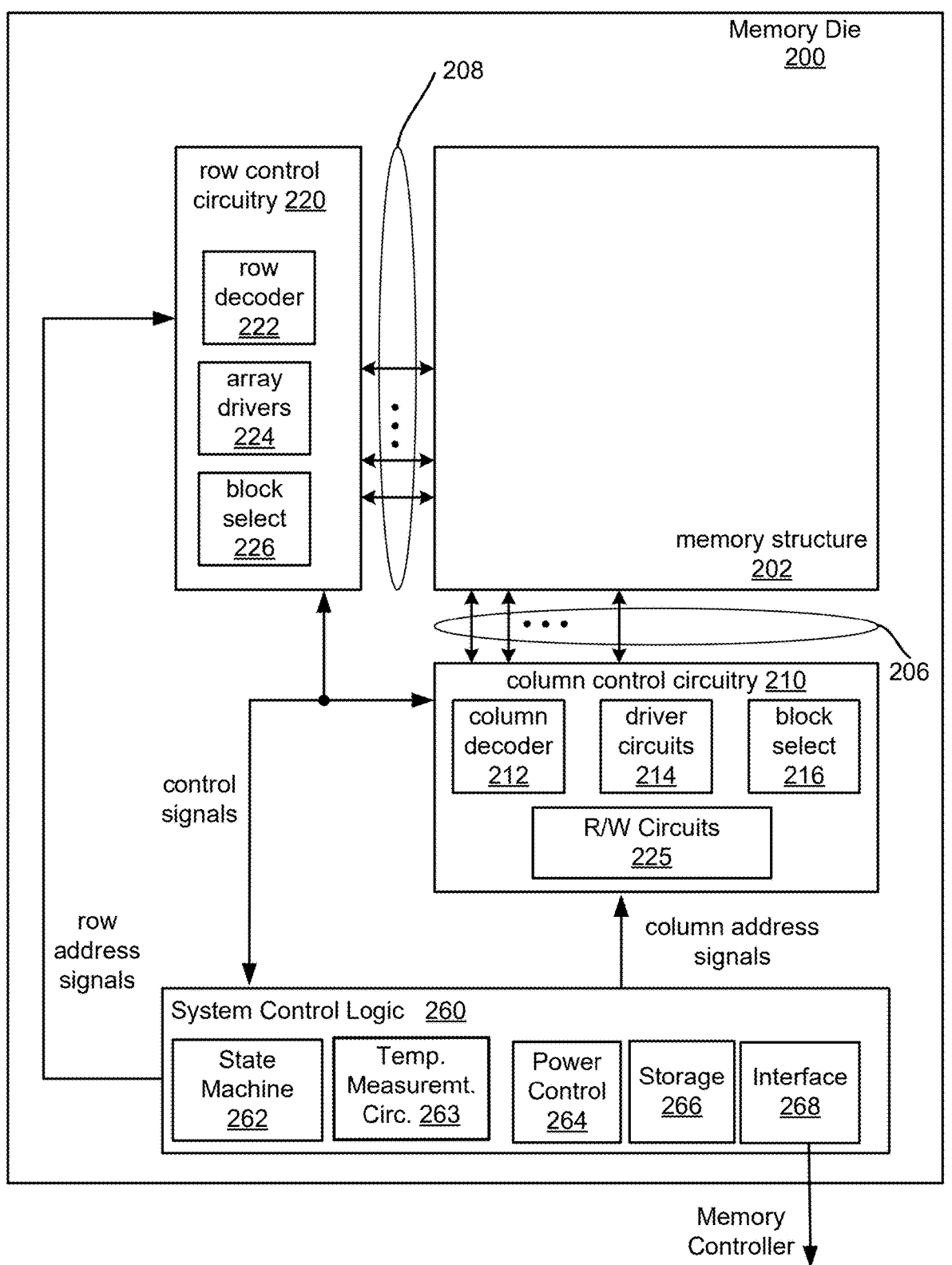
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for memory structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuit 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Temperature measurement circuit 263 may generate temperature measurement values from temperature sensing by one or more temperature transducers located in memory die 200. Temperature measurement values obtained by temperature measurement circuit 263 may be used by system control logic 260, read/write circuits 225 and/or other components to apply temperature adjustment according to on-chip temperature. Temperature measurement circuit 263 may be provided instead of or in addition to temperature measurement circuit 162.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
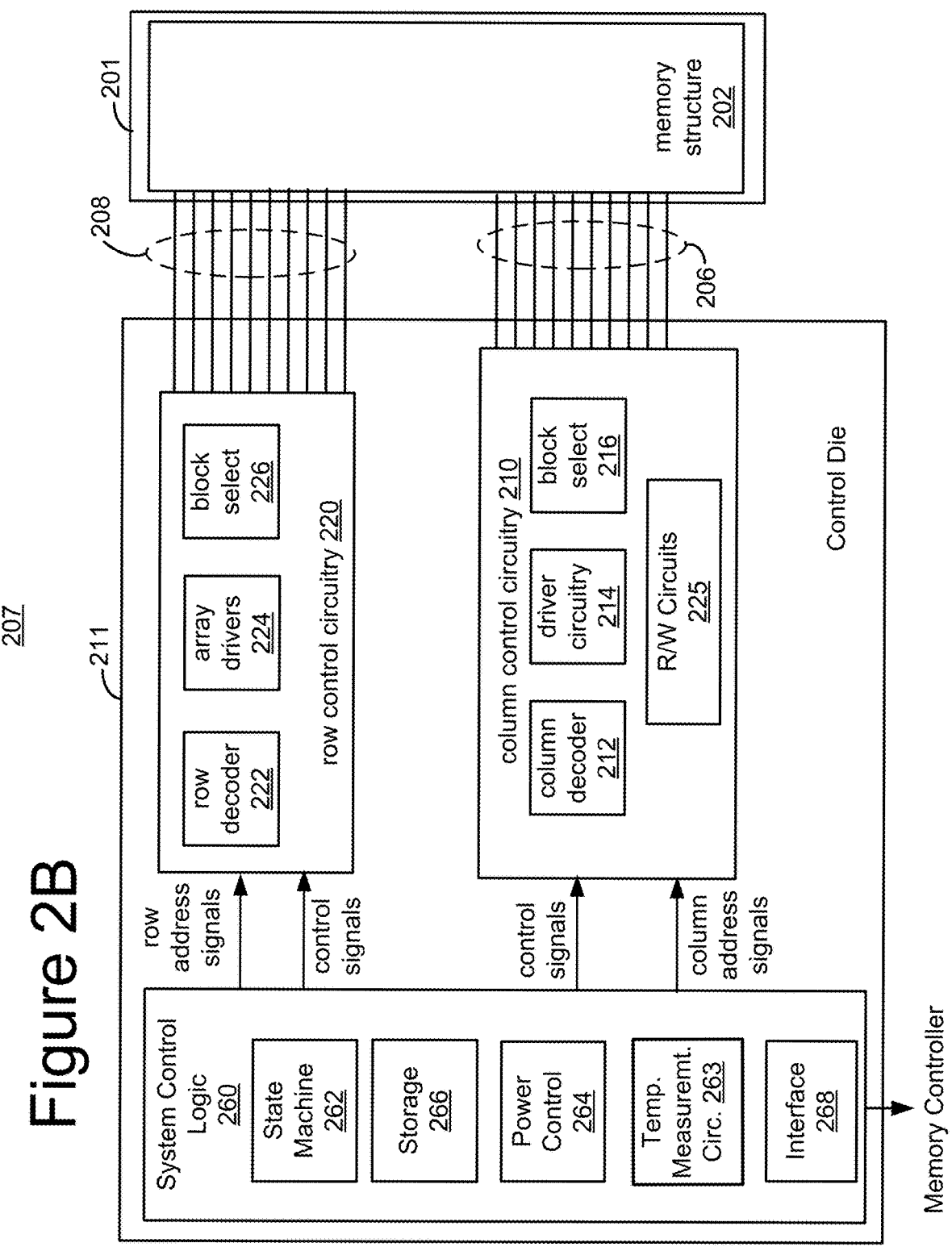
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201. For example, one or more temperature transducer may be provided in memory structure die 201 and may be connected to system control logic 260 in control die 211 so that system control logic 260 may use temperature measurement values obtained from such temperature transducer(s) to adjust operating parameters according to temperature as appropriate. Temperature transducers may also or alternatively be provided in control die 211 and/or memory controller 120.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3:
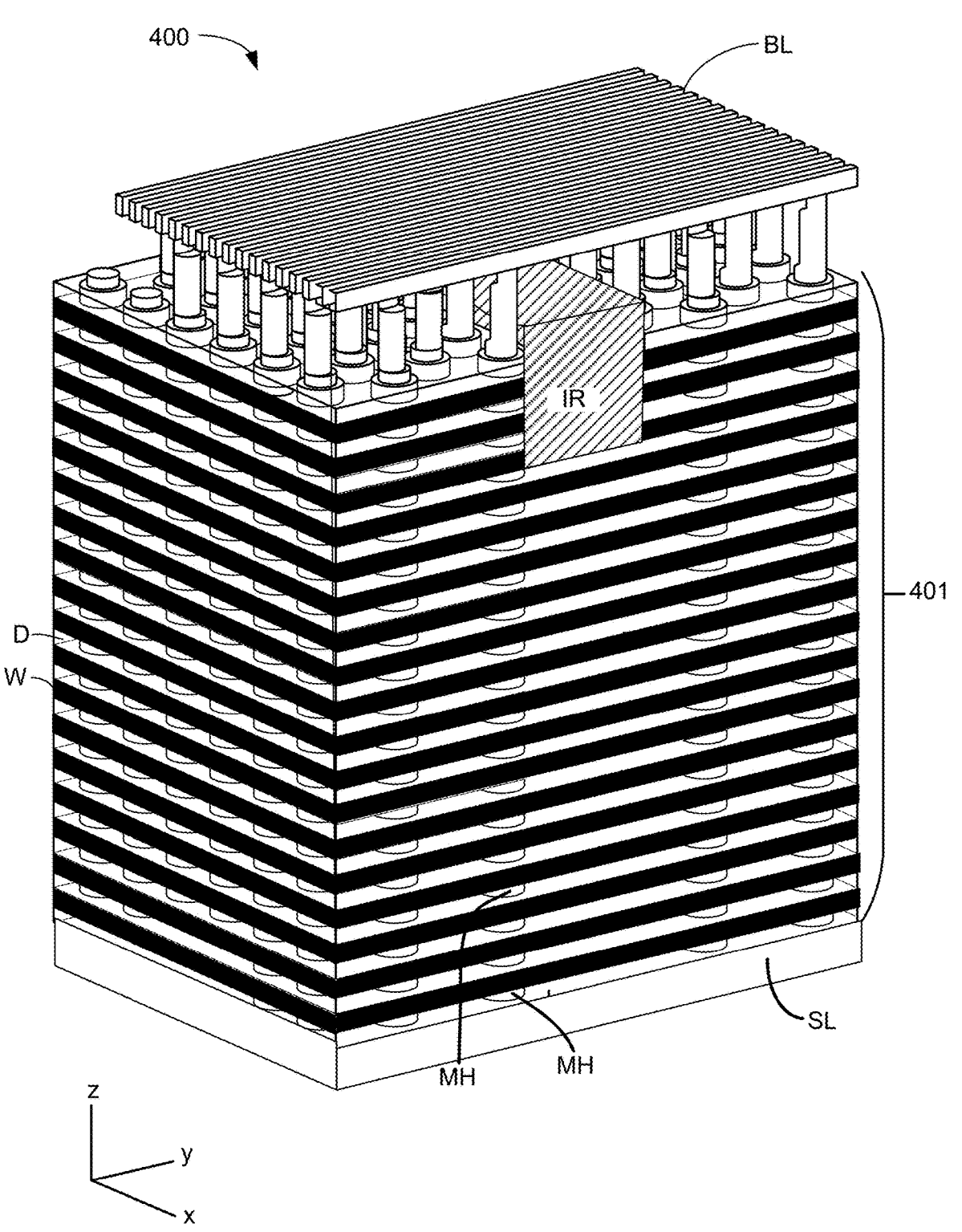
FIG. 3 shows an example of a portion of a memory structure.

FIG. 3 is a perspective view of a portion of one example embodiment of a monolithic three dimensional memory array/structure that can comprise memory structure 202, which includes a plurality non-volatile memory cells arranged as vertical NAND strings. For example, FIG. 3 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 3 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
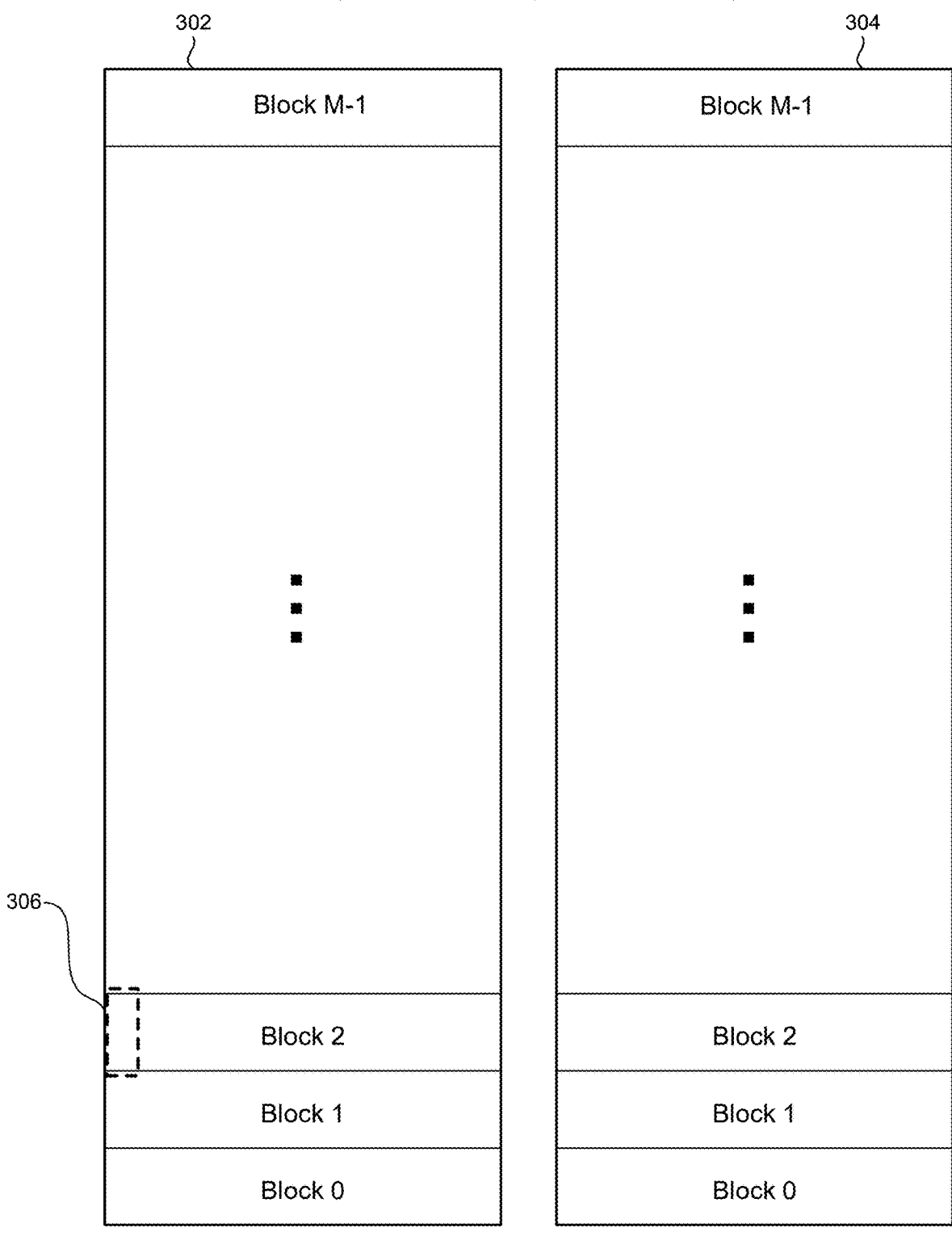
FIGS. 4A-G illustrate an example of a memory structure.

FIG. 4A is a block diagram explaining one example organization of memory structure 202, which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 202 to enable the signaling and selection circuits. In some embodiments, a block represents a groups of connected memory cells as the memory cells of a block share a common set of word lines.

Figure 4B:
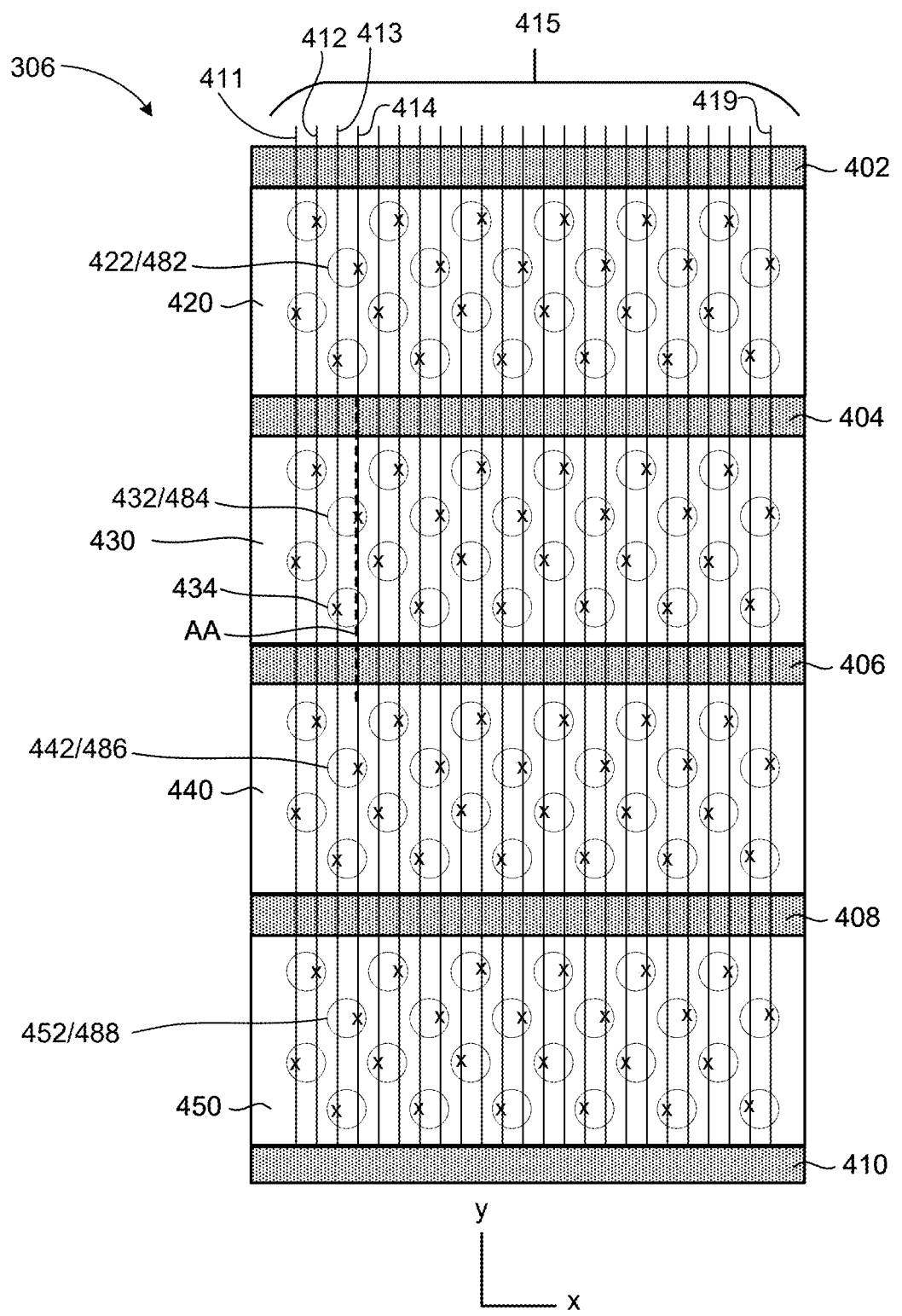

FIGS. 4B-4F depict an example three dimensional ("3D") NAND structure that corresponds to the structure of FIG. 3 and can be used to implement memory structure 202 of FIG. 2A or 2B. FIG. 4B is a block diagram depicting a top view of a portion of one block from memory structure 202. The portion of the block depicted in FIG. 4B corresponds to portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends beyond the portion shown, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
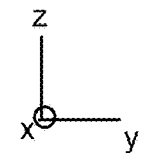

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy word line layer DMLM0 is between vertical sub-block VSB0 and vertical sub-block VSB1. Dummy word line layer DMLM1 is between vertical sub-block VSB1 and vertical sub-block VSB2. The dummy word line layers have dummy memory cell transistors that may be used to electrically isolate a first set of memory cell transistors within the memory string (e.g., corresponding with vertical sub-block VSB0 word lines WLL0-WLL31) from a second set of memory cell transistors within the memory string (e.g., corresponding with the vertical sub-block VSB1 word lines WLL32-WLL63) during a memory operation (e.g., an erase operation or a programming operation).

Figure 4D:
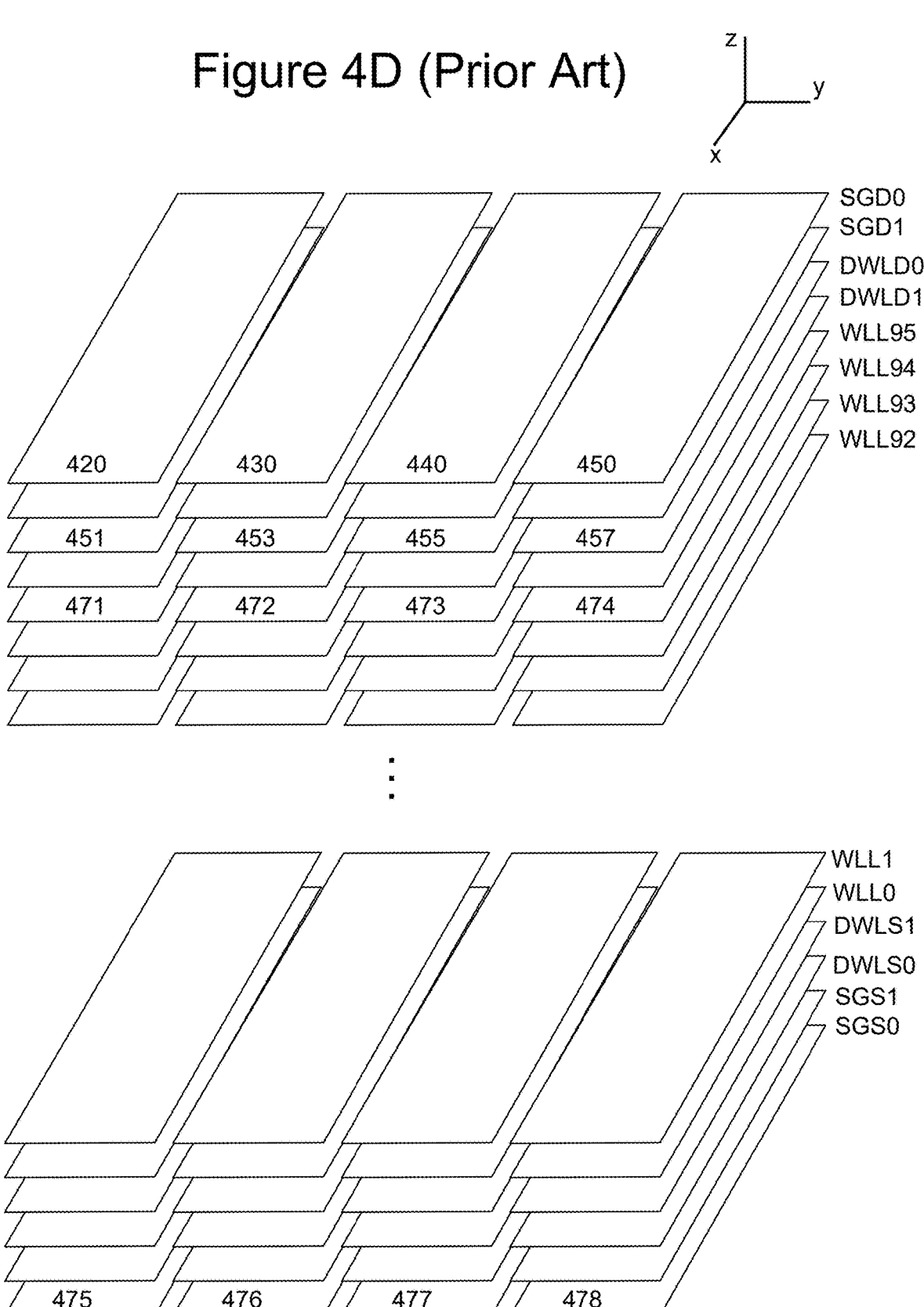

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacture or may be periodically adjusted, while the Vth of the data memory cells changes more frequently, e.g., during erase and programming operations of the data memory cells.

Below the dummy word line layers are the data word line layers. For example, WLL95 comprises word line regions 471, 472, 473 and 474.

Below the data word line layers are the source-side dummy word line layers.

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or the SG lines can be connected and commonly controlled.

Figure 4E:
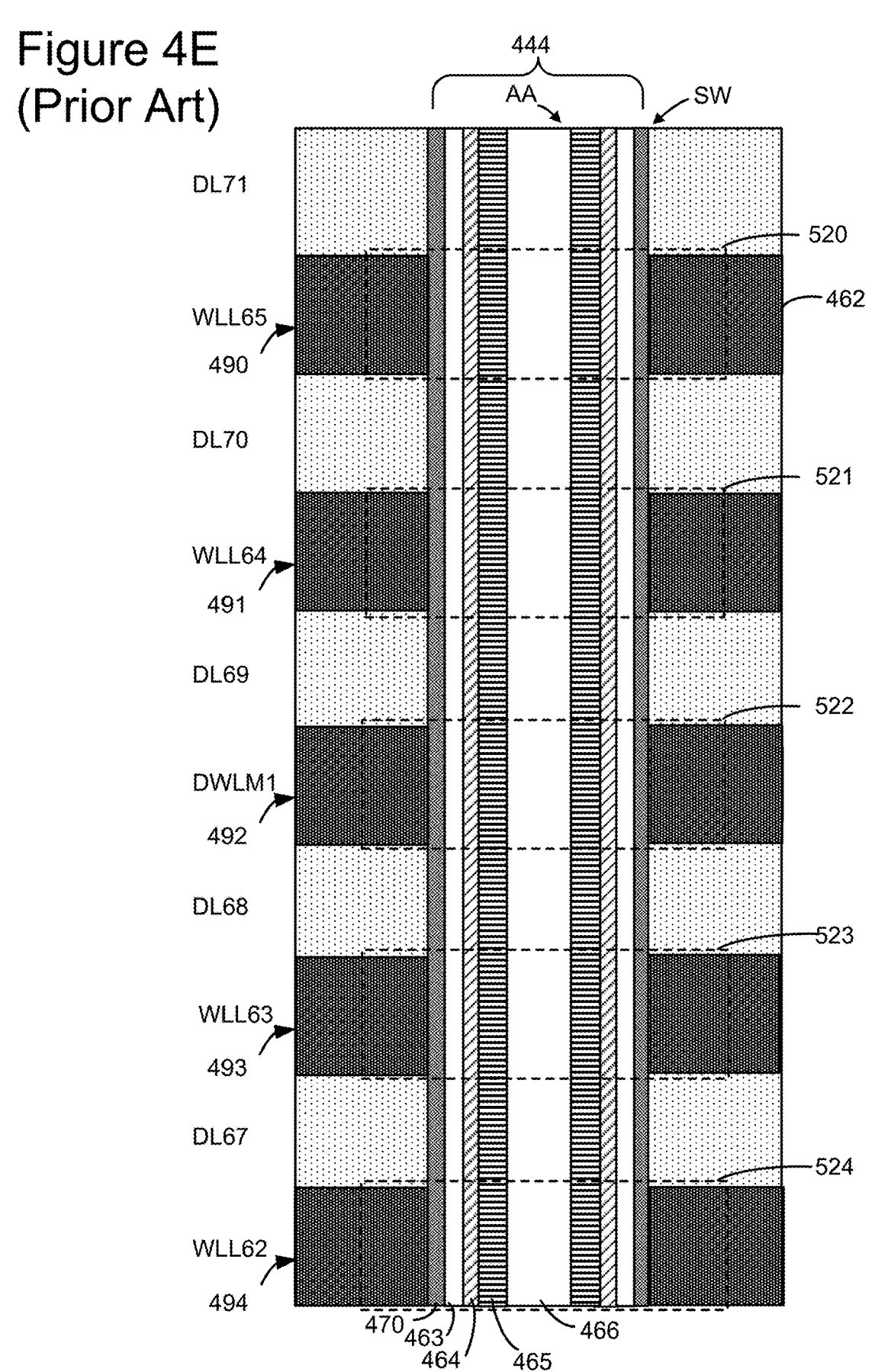

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 4F:
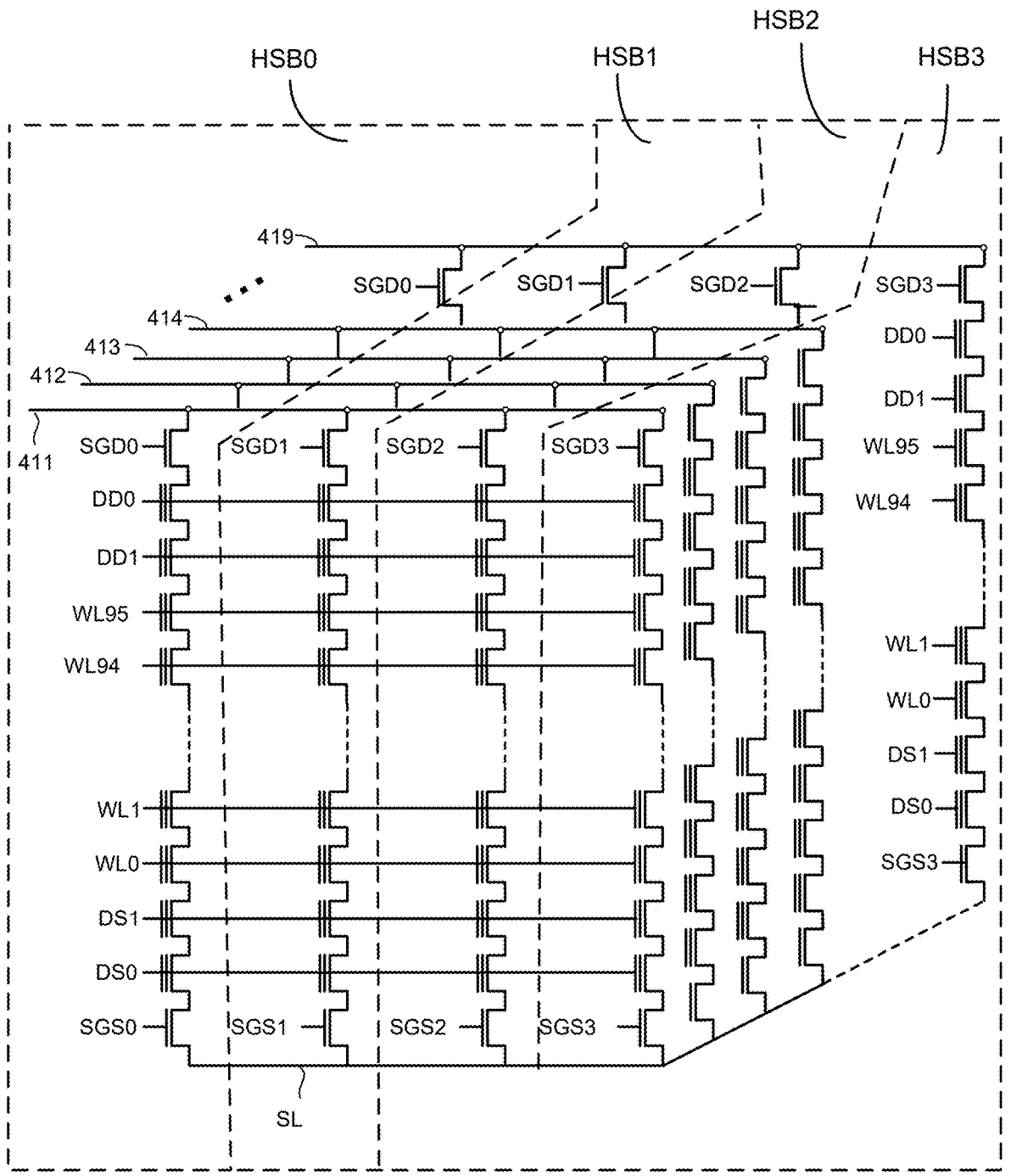

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
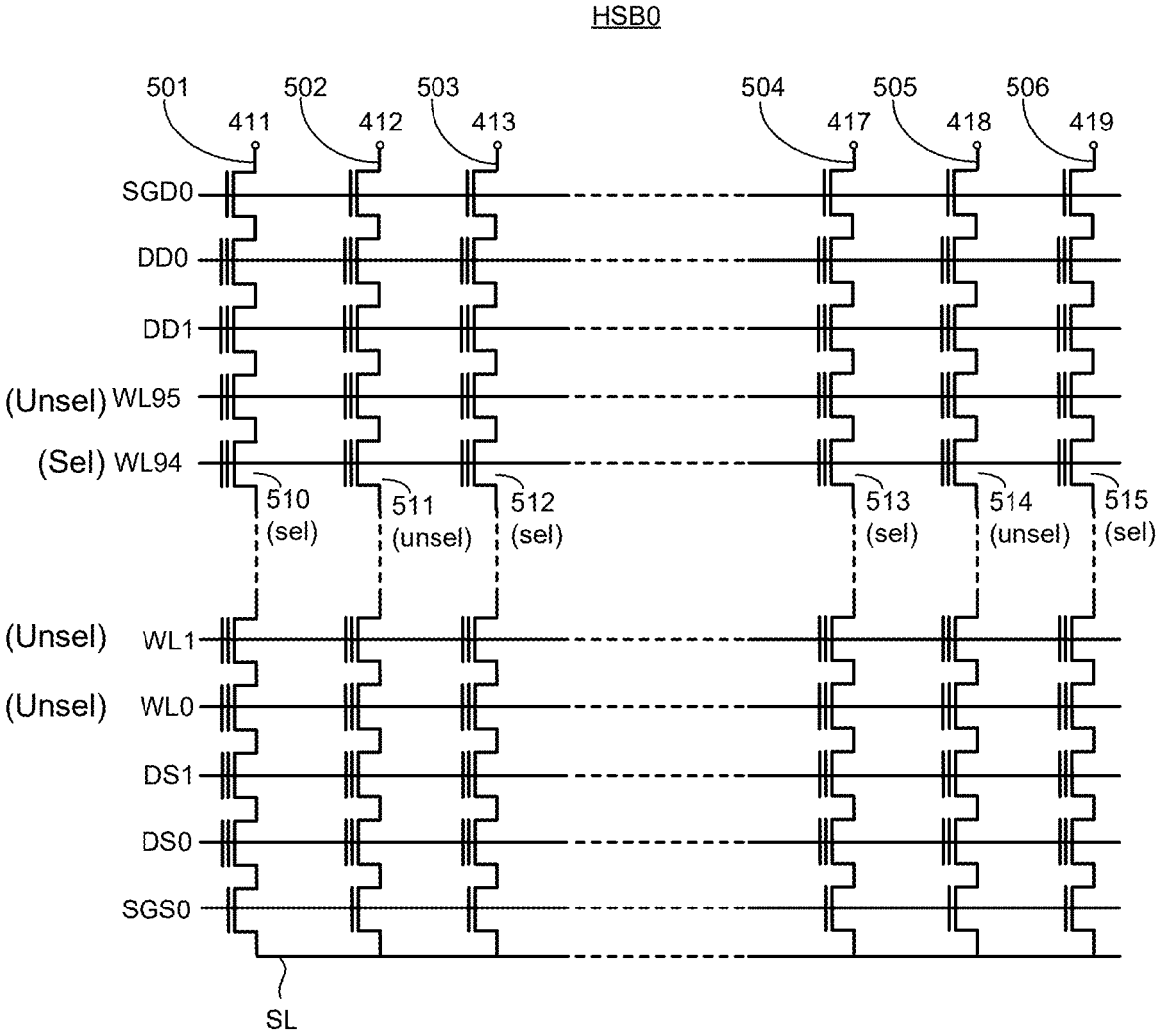

FIG. 4G is a schematic of horizontal sub-block HSB0. Horizontal sub-blocks HSB1, HSB2 and HSB3 have similar structures. FIG. 4G shows physical word lines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same word line as selected memory cells. Unselected memory cells may also be connected to different word lines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that word line WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSO are selected memory cells and some of the memory cells connected to WL94 in horizontal sub-block HSO are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled "unsel" in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled "sel" in FIG. 4G). While some memory cells along WL94 may be considered unselected memory cells because they are to remain in the erased state, WL94 may be considered as a "selected word line" in this scenario because selected memory cells 510, 512, 513 and 515 are connected to WL94 and are accessed via WL94.

Although the example memory system of FIGS. 3-4G is a three dimensional memory structure that includes vertical NAND strings with charge-trapping material, other (2D and 3D) memory structures can also be used with the technology described herein. Different operations for accessing data in non-volatile memory cells (e.g., read, program, program verify) that are described below may be applied to one or more of the example memory systems described above with respect to FIGS. 3-4G.

Figures 5A, 5B:
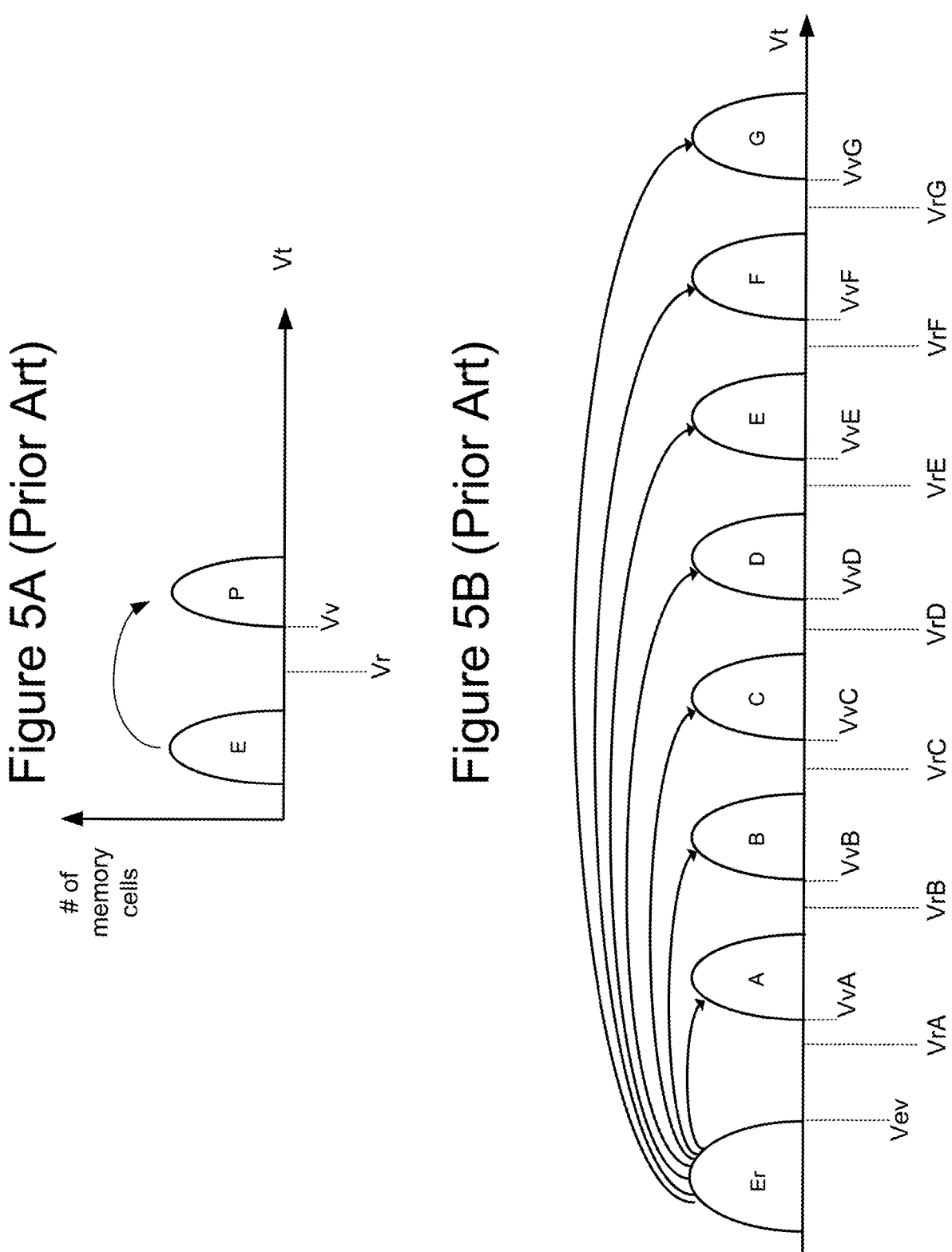
FIGS. 5A and 5B depict threshold voltage distributions.

Memory cells in a memory system may be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, which illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv in a program-verify (or "verify") operation. In some embodiments, verify is not performed during SLC programming.

Memory cells that are configured to store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell). Memory cells may be configured for SLC or MLC storage of data. In some cases, a block of nonvolatile memory cells may be configured for SLC data storage at one time and configured for MLC data storage at another time.

FIG. 5B shows eight threshold voltage distributions, corresponding to eight data states that stores three bits per cell. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify voltages are VvA, VvB, VvC, VvD, VVE, VVF, and VvG. In some embodiments, when programming memory cells to data state A, the system will test whether those memory cells have a threshold voltage greater than or equal to VvA. If the memory cell has a threshold voltage greater than or equal to VvA, then the memory cell is inhibited (locked out) from further programming. Similar reasoning applies to the other data states. In some embodiments, verify is not performed during MLC programming.

Each memory cell programmed according to the scheme illustrated in FIG. 5B, using 8 data states, may store 3 bits of data with each bit associated with a logical page. A read operation may be directed to one or more logical pages of data. Read operations directed to different logical pages may perform reads at different read voltages (e.g., it may not be necessary to perform read steps at all read voltages shown in response to a read request directed to only one or two of the logical pages stored).

While FIGS. 5A-B show threshold voltage distributions as distinct distributions that are separated from each other, real threshold voltage distributions may not be separated as shown (e.g., a distribution may partially overlap one or more neighboring distributions), which may make distinguishing different threshold voltage distributions more challenging. Also, threshold voltage distributions may not be identical across all nonvolatile memory cells of a memory die over time and under different conditions. Threshold voltage distributions may shift for a number of reasons including environmental reasons (e.g., temperature or other external parameter), leakage, effects of programming or erasing neighboring memory cells and effects of read operations on cells being read and/or neighboring cells, which may add to the difficulty of accurately distinguishing different threshold voltage distributions (e.g., when reading nonvolatile memory cells to determine corresponding data states). As the number of data states increases, the threshold voltage ranges for each data state become narrower which may increase overlap of neighboring distributions and provide additional challenges when performing read operations.

Figure 6:
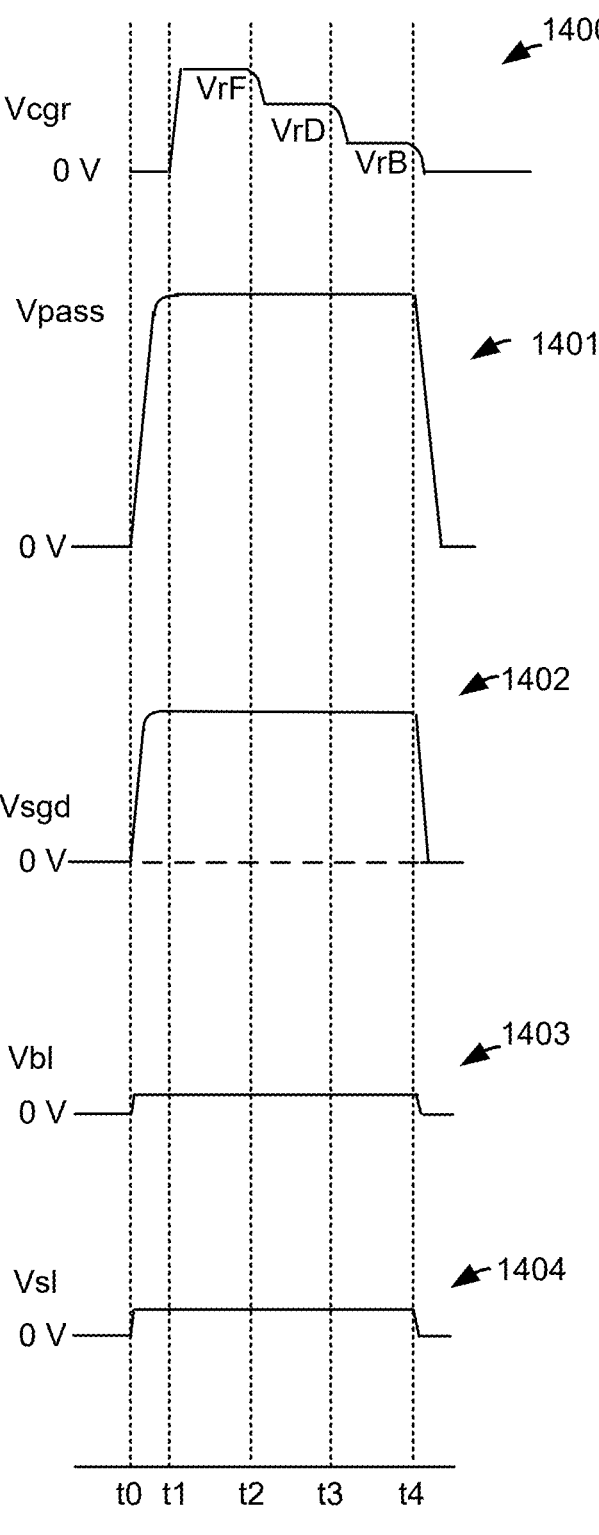
FIG. 6 shows an example of applying read voltages to read memory cells.

FIG. 6 illustrates example voltage signals (plots 1400-1404) for performing a read operation. The voltage 1400 depicts Vegr, the voltage applied to control gates of the selected memory cells via the selected word line, WLn, to perform reads at three different read voltages (e.g., to obtain one logical page of data). The control gate voltage, Vcgr, for reading is set to VrF, VrD and VrB. Sensing occurs during each value of Vegr to determine the data of the logical page. Voltage 1401 denotes the read pass voltages (Vpass) applied to the unselected word lines (e.g., WL0 to WLn−1 and WLn+1 to WL95). Vsgd denotes the SGD voltage 1402 and is set at a high level provided to selected SGD transistors (e.g., SGD0) in a conductive state. Vbl 1403 denotes the bit line voltage applied on bit lines such as bit lines 411 to 419 and is set at a level such as 0.5 V as part of the sensing process. Vsl 1404 denotes the source line voltage applied to SL and can be set at a small positive voltage, in one approach.

At time t0, unselected word line voltage 1401, Vsgd 1402, Vbl 1403 and Vsl 1404 are ramped up to respective target voltages. Subsequently, at time t1, the selected word line voltage, Vcgr 1400, is ramped up to a first read voltage VrF and a first read step is performed to identify which memory cells are on/off with VrF applied to their control gates. Subsequently, at time t2, the selected word line voltage, Vcgr 1400, is ramped down to a second read voltage, VrD, and a second read step is performed to identify which memory cells are on/off with VrD applied to their control gates. Subsequently, at time t3, the selected word line voltage, Vcgr 1400, is ramped down to a third read voltage, VrB, and a third read step is performed to identify which memory cells are on/off with VrB applied to their control gates. Subsequently, at time t4, the selected word line voltage, Vcgr 1400, is ramped down to a post-read voltage (e.g., 0 volts). While the example of FIG. 6 shows a sequence of three different read voltages to read one logical page, in other examples, other sequences with different numbers of read voltages may be used. The present technology is not limited to any particular scheme of applying read voltages.

Figure 7A:
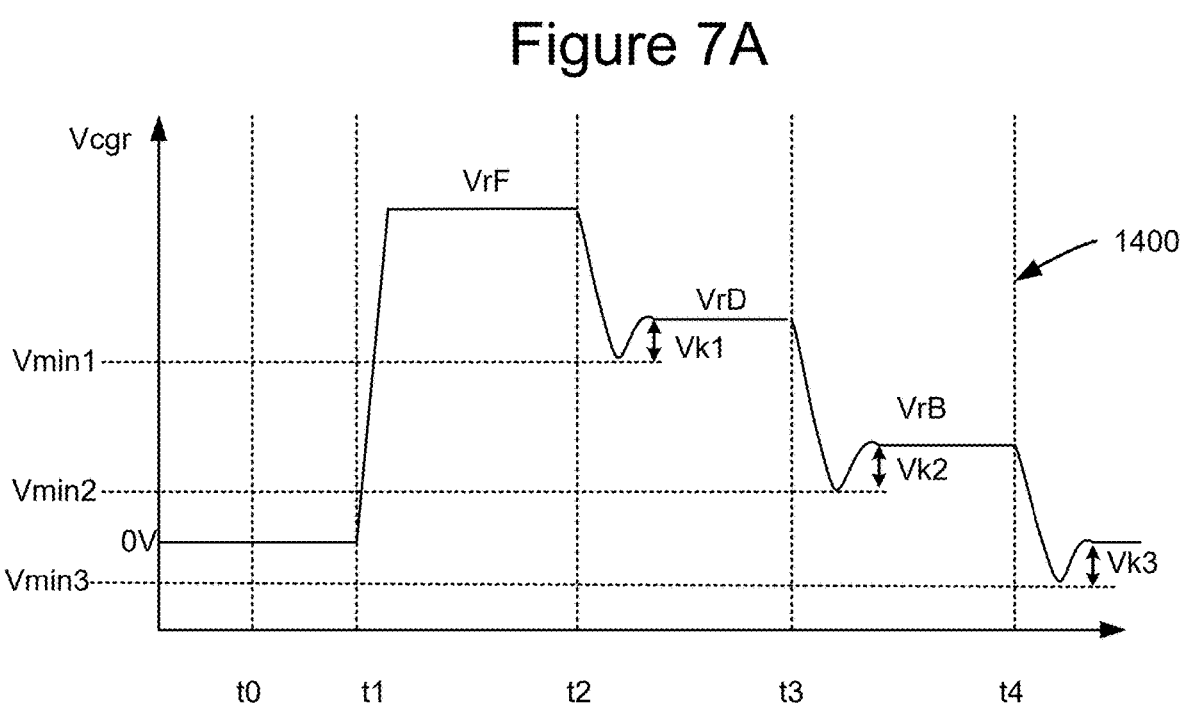
FIGS. 7A-B illustrate a negative voltage kick applied between read voltages.

FIG. 7A shows an example of a selected word line voltage, Vcgr, that includes negative voltage kicks. A negative kick voltage is applied after each read voltage, VrF, VrD and VrB. A negative kick voltage may be applied for a number of reasons as part of a read scheme (e.g., lower error rate, faster ramp down and/or more uniform read results across memory cells of a word line). In the example of FIG. 7A, a first negative kick voltage, Vk1, is applied after first read voltage, VrF, so that Vegr transitions through Vmin1, which is lower than subsequent voltage VrD and then rises to VrD. A second negative kick voltage, Vk2, is applied after second read voltage, VrD, so that Vegr transitions through Vmin2, which is lower than subsequent voltage VrB and then rises to VrB. A third negative kick voltage, Vk3, is applied after third read voltage, VrB, so that Vegr transitions through Vmin3, which is lower than the subsequent voltage, which is 0 volts. In some cases, all negative kick voltages applied to a given word line in a read sequence may be identical (e.g., Vk1=Vk2=Vk3) while in other examples, negative kick voltages may be different (e.g., Vk1≠Vk2≠Vk3).

Figure 7B:
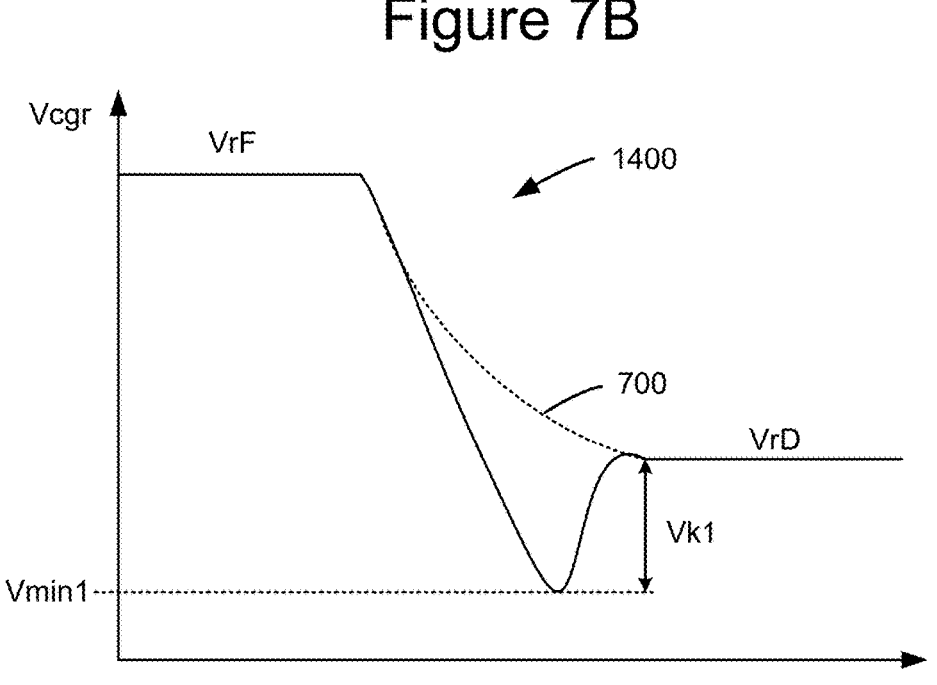

FIG. 7B shows a more detailed view of first negative kick voltage, Vk1, which is applied between first read voltage, VrF, and second read voltage, VrD. Vcgr 1400 (solid line) is the control gate voltage provided by a word line switch circuit or decoder to a word line. While all memory cells along the selected word line may have control gates that are coupled to the word line switch circuit or decoder, not all such memory cells may experience the same voltage. For example, Vcgr may represent the voltage at a control gate of a memory cell transistor that is close to the switch circuit. Memory cells that are more distant from the switch circuit or decoder may experience a different voltage (e.g., because of RC delay along the selected word line between the switch circuit and a distant memory cell). Voltage at a control gate of a more distant memory cell is shown by dashed line 700. Control circuits (e.g., word line switches/decoders) may apply a single voltage signal that includes a voltage kick (e.g., Vcgr 1400 including Vk1) to a selected word line that connects a set of memory cells so that output of the switches/decoders transition through a voltage (e.g., Vmin1) that is lower than a subsequent voltage by a kick voltage (e.g., below VrD by Vk1) although not all memory cells along the selected word line may experience a voltage that is lower than the subsequent voltage (e.g., distant memory cells may experience voltage shown by dashed line 700, which does not transition through a voltage lower than subsequent voltage VrD). For example, word line control circuits may ramp Vcgr down from VrF using voltage setpoint or target of Vmin1 or less than Vmin1 before changing the setpoint or target to VrD. The term "negative kick voltage" refers to the direction of the kick below the subsequent voltage (e.g., VrD) and does not necessarily mean a voltage below zero volts in this context (e.g., Vmin1 may be greater than 0 volts).

Figure 8A:
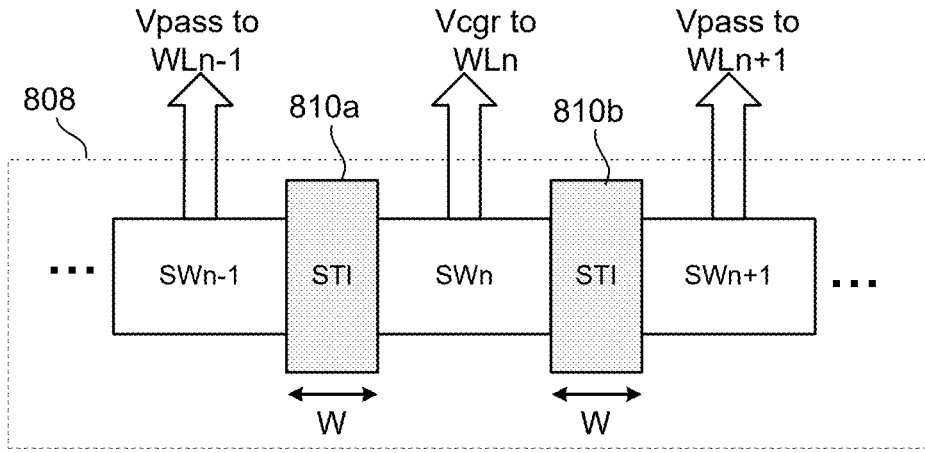
FIGS. 8A-B illustrate examples of word line switch circuits and voltages produced by word line switch circuits.

FIG. 8A shows an example of a portion of word line control circuits 808 that includes word switches (SWs) that provide voltages to a selected word line (e.g., SWn provides Vcgr to WLn) and to word lines on either side of the selected word line (e.g., SWn−1 provides Vpass to WLn−1 and SWn+1 provides Vpass to WLn+1) during a read operation (e.g., providing voltages illustrated in FIGS. 6-7B). Individual word line switches are electrically isolated from neighboring word line switches by Shallow Trench Isolation (STI) structures, including STI 810*a* between SWn−1 and SWn and STI 810*b* between SWn and SWn+1. STI structures may provide sufficient electrical isolation to prevent significant coupling between neighboring switches. The isolation provided by a given STI structure may be proportional to the width of the structure (e.g., STI 810*a* and STI 810*b* are shown having width=W, where electrical isolation increases with W). The value of W may be chosen according to a maximum voltage difference expected between components (e.g., switches or transistors) of neighboring switches (e.g., between SWn and SWn−1 and between SWn and SWn+1), where less isolation (smaller value of W) is sufficient for a smaller voltage difference and more isolation (larger value of W) may be required for a larger voltage difference. STI structures may occupy a significant area of word line control circuits 808 so that reducing STI dimensions may provide a significant saving in area of word line control circuits 808.

Figure 8B:
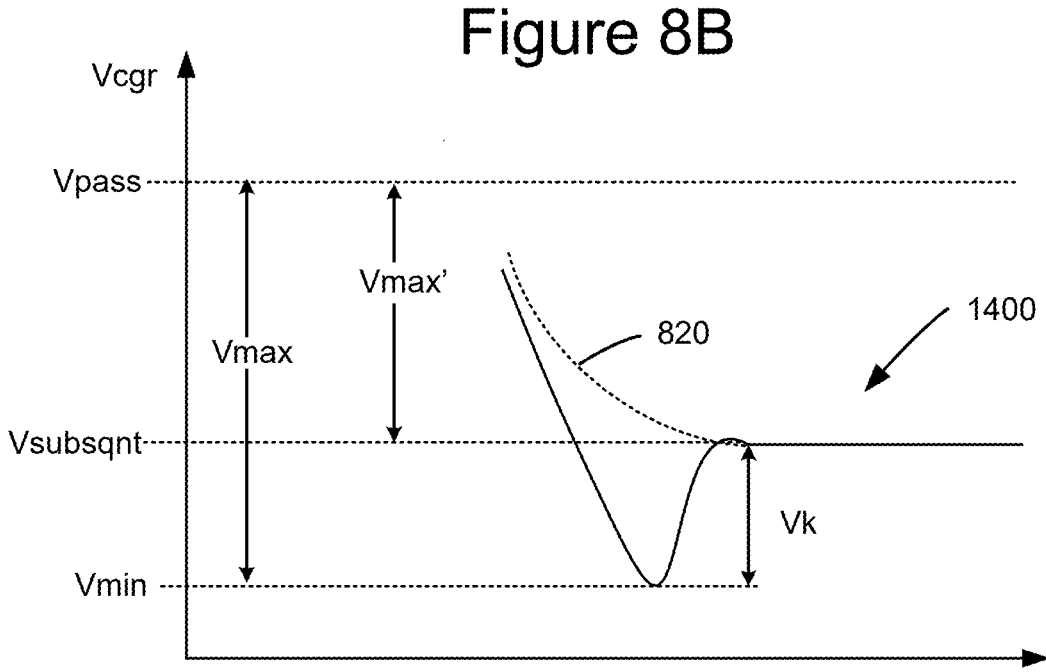

FIG. 8B illustrates an example of a maximum voltage, Vmax, between components of neighboring switches, including a switch for a selected word line, SWn, during a read operation. Voltage on the selected word line, Vcgr, is shown by voltage 1400, which includes negative kick voltage, Vk, as before. Voltage on neighboring switches (SWn−1 and SWn+1) during programming of memory cells along WLn is shown by Vpass. Vmax is the difference between Vpass and Vmin, which is the lowest voltage through which Vcgr transitions when the kick voltage is applied.

According to examples of the present technology, reducing Vmax may allow STI width W to be reduced accordingly so that the overall area of word line control circuits 808 may be reduced. For example, a negative kick voltage may be selectively applied to some word lines in a memory structure, while no negative kick voltage may be applied to other word lines in the same memory structure (e.g., plot 820 corresponds to voltage applied to a selected word line, Vcgr, with no negative kick (e.g., Vk=0) so that voltage does not transition through any voltage below the subsequent voltage, Vsubsqnt). In this case, the maximum voltage difference between components of the word line switch for the selected word line, SWn, and neighboring switches, SWn−1 and SWn+1, has a maximum value of Vmax', which is less than Vmax, so that STI dimensions may be reduced accordingly and area occupied by word line control circuits 808 may be reduced. While FIG. 8B shows an example with two options, applying a nonzero kick voltage or not applying a kick voltage (kick voltage=0), in other examples, two or more nonzero kick voltages may be applied to different word lines.

Figure 9A:
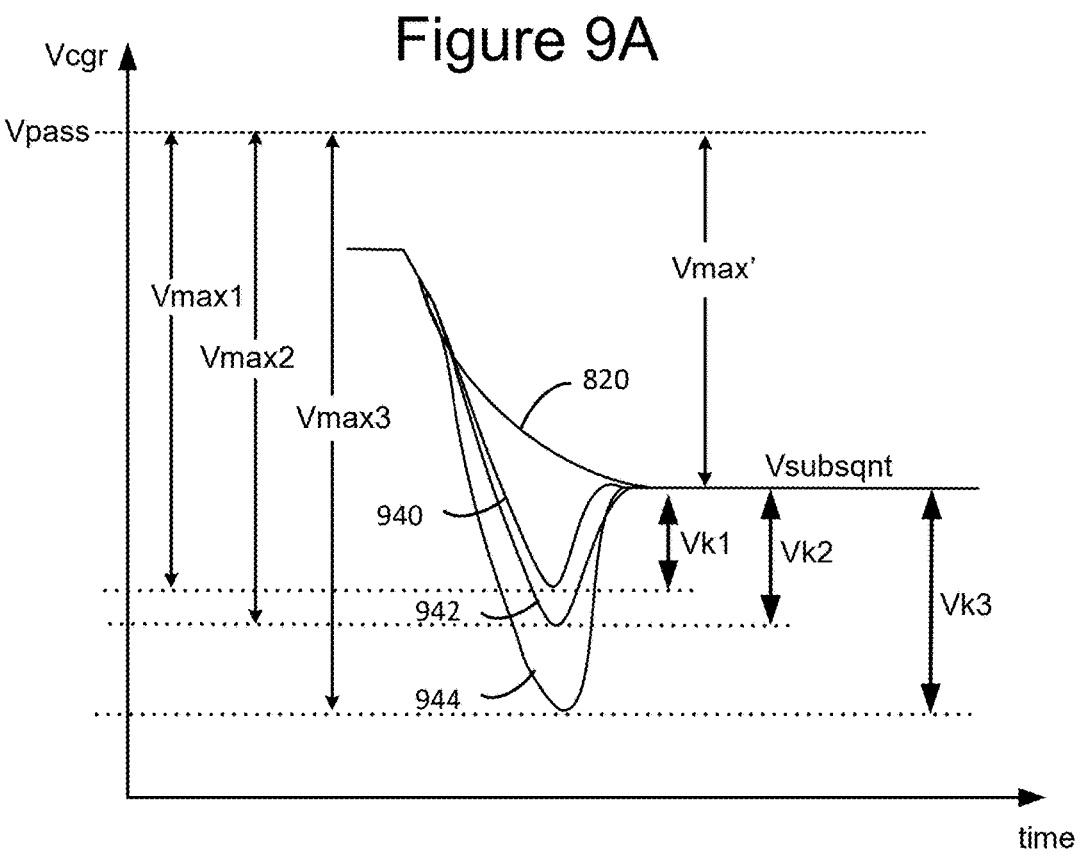
FIGS. 9A-B illustrate an examples of different negative kick voltages.

FIG. 9A illustrates an example of the present technology that shows a number of different nonzero kick voltages applied to different word lines in a nonvolatile memory structure. FIG. 9 shows a first plot 940 of voltage on a selected word line, Vcgr, that includes a first kick voltage Vk1, which results in a maximum voltage difference between a word line switch for the selected word line and neighboring word line switches of Vmax1. A second plot 942 shows voltage on a selected word line that includes a second kick voltage Vk2, which results in a maximum voltage difference between a word line switch for the selected word line and neighboring word line switches of Vmax2. A third plot 944 shows voltage on a selected word line that includes a third kick voltage Vk3, which results in a maximum voltage difference between a word line switch for the selected word line and neighboring word line switches of Vmax3. The number of different negative kick voltages (e.g., Vk1, Vk2, Vk3, . . . ) may be configured according to requirements. In addition, FIG. 9A shows plot 820, corresponding to a kick voltage of zero volts (e.g., voltage does not transition below Vsubsqnt) so that the maximum voltage difference between a word line switch for the selected word line and neighboring word line switches is Vmax'=Vpass-Vsubsqnt. The maximum voltage difference in each plot is Vmax'+Vk, where "Vk" refers to the kick voltage applied (e.g., plot 820 shows Vk=0, plot 920 shows Vk=Vk1, plot 942 shows Vk=Vk2 and plot 944 shows Vk=Vk3). Reducing the maximum voltage difference where possible by reducing Vk may allow some reduction in area of word line control circuits (e.g., compared with using a uniform Vk and corresponding uniform W).

Different negative kick voltages (including zero negative kick voltage) may be applied on a WL-to-WL basis as described above and/or different negative kick (including, in some cases, zero negative kick) voltages may be applied on a transition-to-transition basis so that, for example, one or more transition may include a negative kick voltage while another one or more transition of the same program operation may not include a negative kick voltage (zero kick voltage).

Figure 9B:
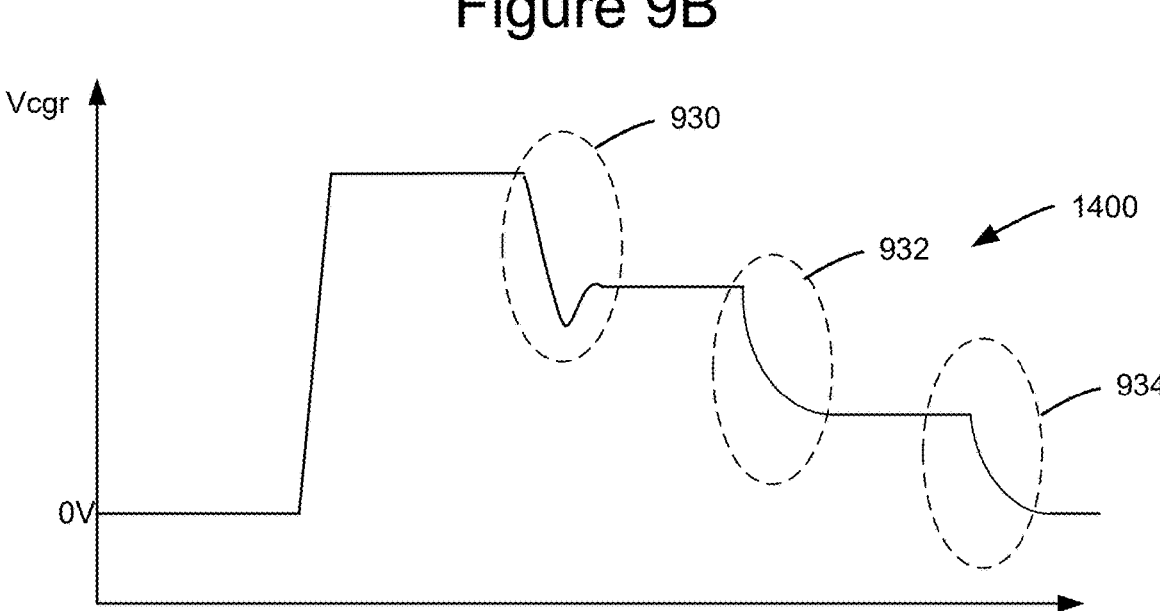

FIG. 9B shows voltage Vcgr 1400 for a read operation that includes three transitions (e.g., ramping-down from three different read voltages). In the example of FIG. 9B a first transition 930 includes a nonzero negative voltage kick (e.g., as previously shown in FIGS. 7A-B) while a second transition 932 and a third transition 934 do not include a negative kick voltage.

Figure 10:
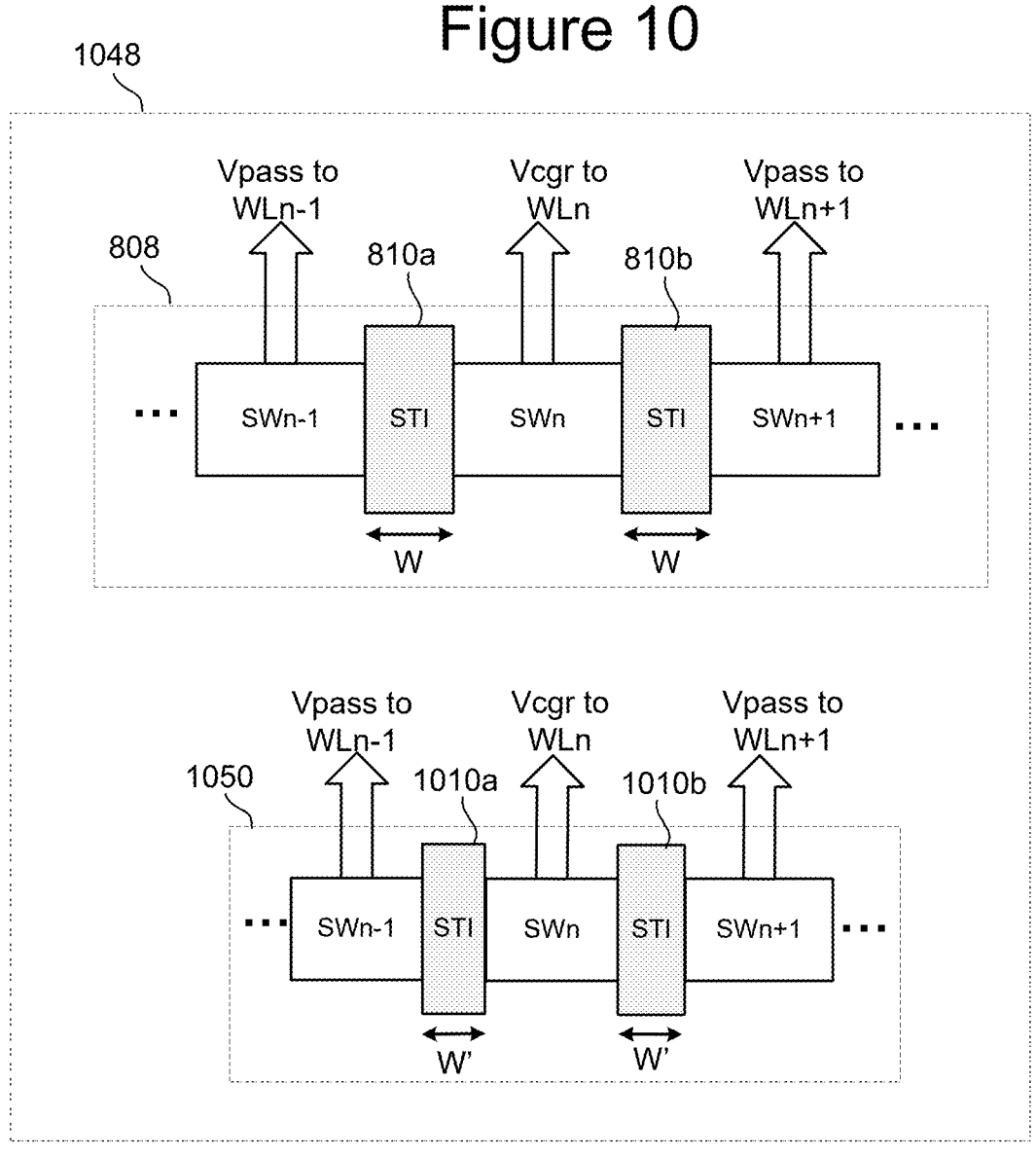
FIG. 10 illustrates an example of word line control circuits that include different portions with components in each portion having different dimensions.

FIG. 10 illustrates an example of word line control circuits 1048 according to an example of the present technology. FIG. 10 includes a first portion of word line control circuits 808, which includes STI 810a and 810b, which have a width W to provide electrical isolation between a switch for a selected word line, SWn, and neighboring word line switches as previously shown in FIG. 8A. In addition, word line control circuits 1048 include a second portion of word line control circuits 1050, which includes STI portions 1010a and 1010b, which have a width W', which is less than W, to provide electrical isolation between a switch for a selected word line and neighboring word line switches. For example, while word line switches of first portion of word line control circuits 808 may be configured to apply a kick voltage to a selected word line during read operations, word line switches of second portion of word line control circuits 1050 may be configured to apply a smaller kick voltage or no kick voltage to a selected word line during read operations. Word line control circuits 1048 may ramp down from a read voltage to subsequent voltage (e.g., subsequent read voltage of a sequence) such that voltage on a word line transitions through a voltage that is below a subsequent voltage by a negative kick voltage, apply a first negative kick voltage (e.g., Vk1) to ramp down from a read voltage on a first word line and apply a second negative kick voltage (e.g., Vk2) to ramp down from the read voltage on a second word line.

While two portions of wordline control circuits 808 and 1050 with two different dimensions (W and W') based on two different negative kick voltages are shown, any number of different portions with different dimensions may be provided to generate any number of negative kick voltages (and/or zero kick voltage). Word line control circuits 1050 may be considered an example of means for selectively applying negative kick voltages on word lines in ramp downs between read voltages including applying a first negative kick voltage to a first ramp down from a first read voltage to a second read voltage on a first word line, apply a second negative kick voltage to a second ramp down from the first read voltage to the second read voltage on a second word line and apply no negative kick voltage to a third ramp down from the first read voltage to the second read voltage on a third word line.

While reduced STI dimensions provide an example of area reduction enabled by reduced kick voltage, other size deduction (e.g., reduced switch or transistor size) may be enabled by reduction in voltage differences and the present technology is not limited to reduction in any particular dimension or dimensions.

Different negative kick voltages may be applied to different word lines according to various different schemes. For example, in some 3-D memory structures, different physical levels may be different in such a way that different kick voltages may be applied (e.g., effects of different kick voltages may be layer-dependent).

Figure 11:
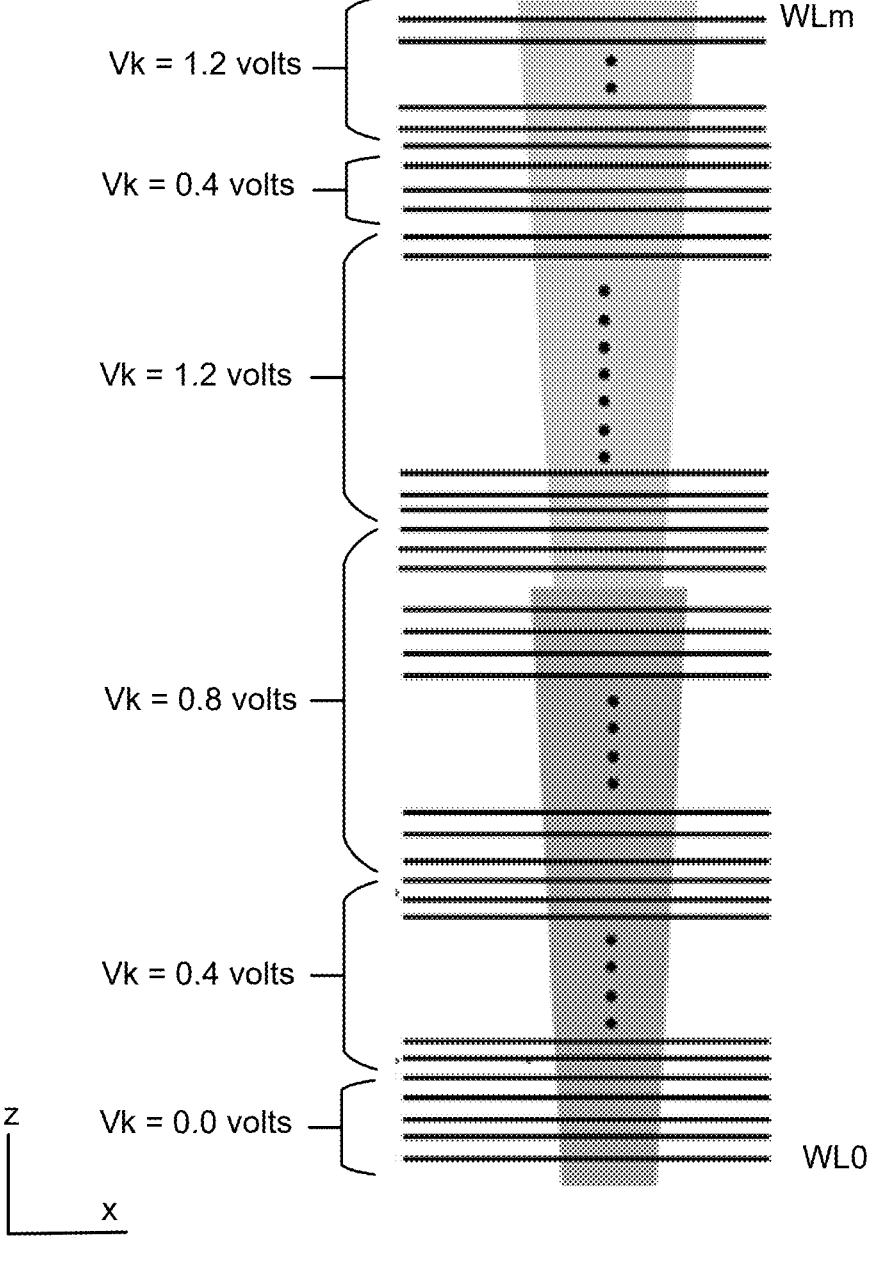
FIG. 11 shows an example of a scheme for applying different negative kick voltages when reading memory cells at different physical levels.

FIG. 11 shows an example of a portion of 3-D memory structure that includes a memory hole that is formed by etching (e.g., two etch steps) so that memory hole diameter changes as a function of level (height above a substrate) between a lowest word line (WL0) level and a highest (WLm) level (e.g., WLm may correspond to WL95 of FIGS. 4C-G). FIG. 11 also shows an example of a kick voltage scheme that applies different kick voltages at different levels including applying a kick voltage of zero volts (Vk=0.0 volts) to lowermost levels including WL0, applying a kick voltage of 0.4 volts (Vk=0.4 volts) to next lowest levels, applying a kick voltage of 0.8 volts (Vk=0.8 volts) to next lowest levels, applying a kick voltage of 1.2 volts (Vk=1.2 volts) to next lowest levels, applying a kick voltage of 0.4 volts to next lowest levels (Vk=0.4) and applying a kick voltage of 1.2 volts (Vk=1.2 volts) to uppermost levels including WLm. The grouping of different word line levels and the assignment of different kick voltages to such groups may be based on modeling and/or testing and may be a one-time configuration (e.g., as part of initialization) or may be configured more than once (e.g., subsequent to some period of use). Negative kick voltages to be applied to word lines of different groups may be saved in a record (e.g., in the form of a lookup table or other such record). Prior to performing a read operation, a corresponding negative kick voltage may be obtained from the record (e.g., using the level of a word line indicated by a read command to lookup a table).

In some cases, different portions of a memory structure may have different characteristics (e.g., due to process variation and/or other factors). For example, different planes, blocks, sub-blocks or other units may have different characteristics and different negative kick voltages may be assigned accordingly.

Figure 12:
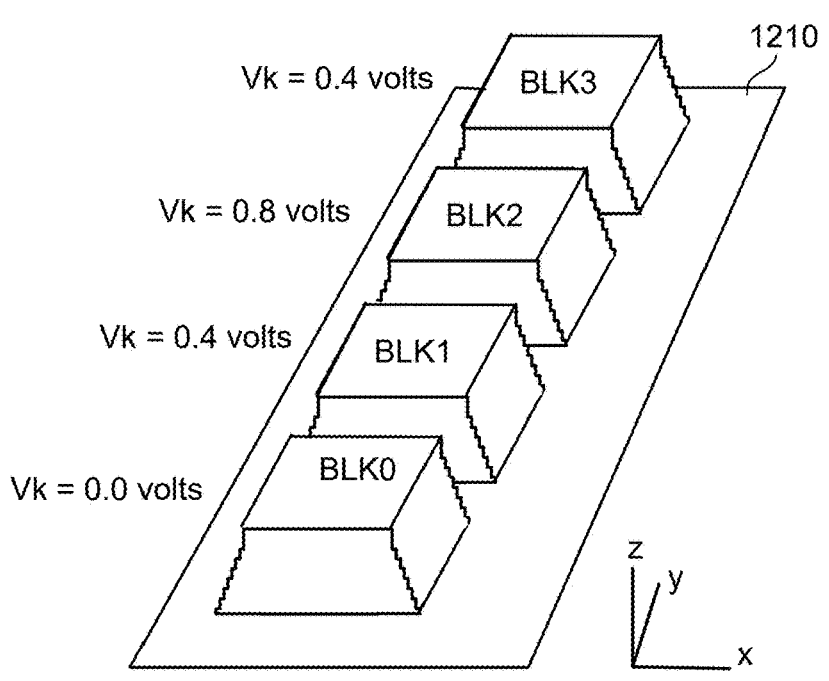
FIG. 12 shows an example of a scheme for applying different negative kick voltages when reading memory cells of different blocks.

FIG. 12 shows an example of a portion of a memory structure (e.g., memory structure 202) formed on a substrate 1210 that includes four blocks, BLK0 to BLK3. FIG. 12 also shows an example of a scheme that applies different kick voltages according to block. A different kick voltage is applied when performing read operations in each block including applying zero kick voltage (Vk=0.0 volts) when reading from BLK0, applying a kick voltage of 0.4 volts (Vk=0.4 volts) when reading from BLK1, applying a kick voltage of 0.8 volts (Vk=0.8 volts) when reading from BLK2 and applying a kick voltage of 0.4 volts (Vk=0.4 volts) when reading from BLK3.

Figure 13:
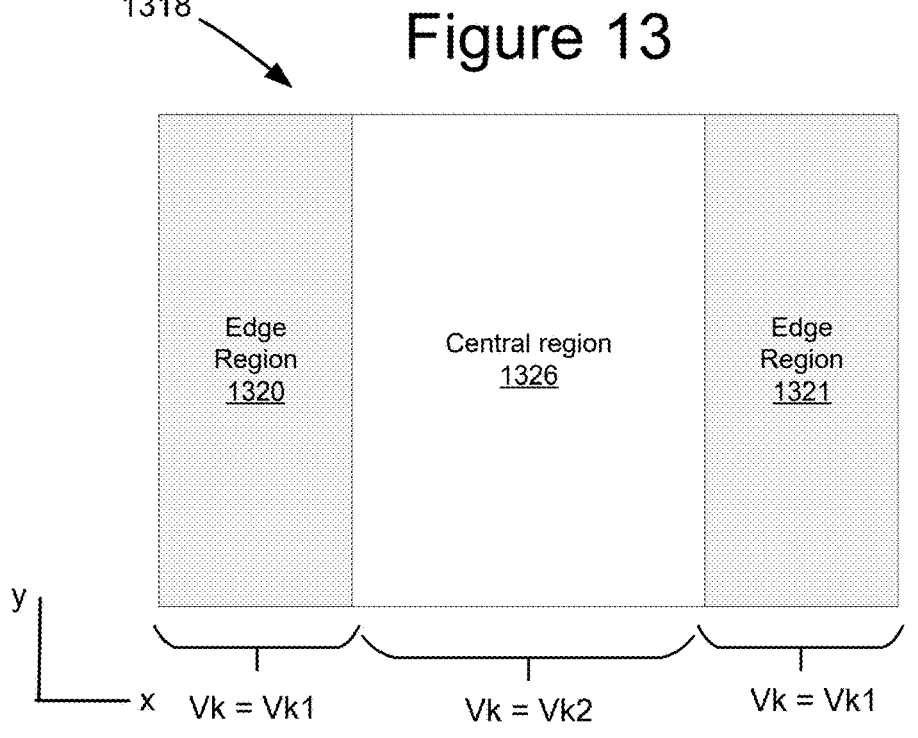
FIG. 13 shows an example of a scheme for applying different negative kick voltages when reading memory cells of different word lines of a block.

FIG. 13 shows an example of a block 1318 (e.g., any of BLK0 to BLK3) formed in a memory structure (e.g., memory structure 202). Block 1318 includes edge regions 1320 and 1321 and central region 1326. Characteristics of edge and central regions may be different and different voltages may be applied accordingly. FIG. 13 shows a first negative kick voltage (Vk=Vk1) applied to first word lines located in edge regions 1320-1321 of block 1350 and a second negative kick voltage (Vk=Vk2) applied to word lines located in central region 1326 of block 1318. A kick voltage scheme such as illustrated may be applied to all blocks of a memory die or may be applied selectively (e.g., some blocks may apply the same negative kick voltage in edge and central regions).

In some cases, temperature and/or other external factors may affect a read operation and reads at different temperatures may be facilitated by applying different kick voltages as a function of temperature.

Figure 14:
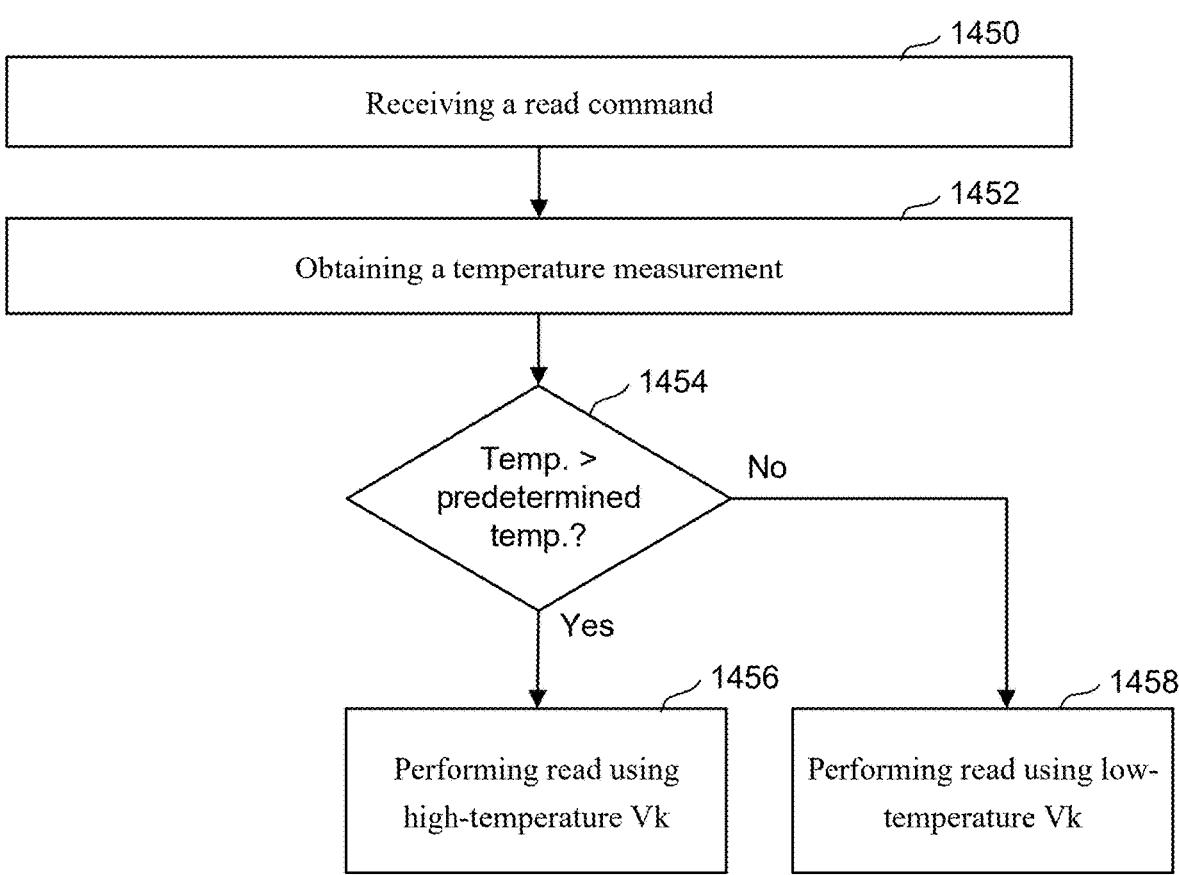
FIG. 14 shows an example of a method that includes reading with different read parameters according to temperature.

FIG. 14 shows an example of a method that includes receiving a read command 1450, obtaining a temperature measurement 1452 (e.g., from temperature measurement circuit 162, temperature measurement circuit 263 or otherwise) and determining if the temperature is greater than a predetermined temperature 1454. If the temperature is greater than the predetermined temperature then the method includes performing the read using a high-temperature Vk 1456, while if the temperature is not greater than the predetermined temperature then the method includes performing the read using a low-temperature Vk 1458. While just two kick voltages (high-temperature Vk and low-temperature Vk) are used for two temperature ranges (above and below the predetermined temperature) in this example, in other examples three or more different kick voltages may be applied based on three or more temperature ranges.

While each of the above examples describes applying different kick voltages according to a particular factor, in some cases, different kick voltages may be selected based on two or more factors. For example, when a read command is received, the physical address to be read may be used to adjust kick voltage according to the physical level of a selected word line to be read (first adjustment), according to the block in which the selected word line is located (second adjustment), according to the location of the word line in the block, in a central or edge region (third adjustment) and/or according to temperature (fourth adjustment). Other adjustments may be additionally/alternatively made.

FIG. 15 shows an example of a method that may be applied to any apparatus described above (e.g., to reading nonvolatile memory cells in a memory structure that includes word lines coupled to nonvolatile memory cells). The method includes applying a first read voltage (e.g., VrF) on a first word line 1562, subsequently transitioning voltage on the first word line from the first read voltage to a second read voltage (e.g., VrD) through a first negative kick voltage that is less than the second read voltage 1564 (e.g., transitioning through Vk1 as shown in FIG. 7B). The method further includes applying the first read voltage on a second word line 1566 and subsequently transitioning voltage on the second word line from the first read voltage to the second read voltage through a second negative kick voltage that is less than the second read voltage 1568 (e.g., as shown in FIG. 9).

FIGS. 16A-C illustrate additional aspects of the present technology that may be combined with the method illustrated in FIG. 15. FIG. 16A shows steps including applying the first read voltage on a third word line 1670 (e.g., applying VrF) and subsequently transitioning voltage on the third word line from the first read voltage to the second read voltage without a negative kick voltage such that voltage on the third word line does not transition through any voltage less than the second read voltage 1672 (e.g., plot 820).

FIG. 16B shows steps including maintaining a record of negative kick voltages to be applied to different word lines including the first word line and the second word line 1674 and prior to performing a read operation, obtaining a corresponding negative kick voltage from the record 1676. FIG. 16B further shows testing the nonvolatile memory cells (e.g., periodically, with respect to time or cycles) to obtain test results 1678, obtaining negative kick voltages to be applied to different word lines from the test results 1680 and storing the obtained negative kick voltages in the record 1682.

FIG. 16C shows steps including obtaining a plurality of temperature measurements 1684 (e.g., in response to receiving read commands), comparing each of the plurality of temperature measurements with a predetermined temperature 1686, selecting the first negative kick voltage in response to obtaining a temperature measurement above the predetermined temperature 1688 and selecting the second negative kick voltage in response to obtaining a temperature measurement below the predetermined temperature 1690 (e.g., see FIG. 14).

According to examples of the present technology, an apparatus includes control circuits configured to connect to a plurality of nonvolatile memory cells. The one or more control circuits are configured to apply read voltages on a plurality of word lines connected to the nonvolatile memory cells, ramp down from the read voltages to subsequent voltages such that voltage on a word line transitions through a voltage that is below a subsequent voltage by a negative kick voltage. The one or more control circuits are further configured to apply a first negative kick voltage to ramp down from a read voltage on a first word line and apply a second negative kick voltage to ramp down from the read voltage on a second word line.

In one or more embodiments, the one or more control circuits are further configured to apply no negative kick voltage on additional word lines such that voltage on an additional word line does not transition the read voltage to a subsequent voltage through any voltage that is below the subsequent voltage.

In one or more embodiments, the plurality of nonvolatile memory cells are arranged in a plurality of levels and the one or more control circuits are further configured to apply the first negative kick voltage to first word lines of a first plurality of levels and apply the second negative kick voltage to word lines of a second plurality of levels.

In one or more embodiments, the plurality of nonvolatile memory cells are arranged in a plurality of blocks and the one or more control circuits are further configured to apply the first negative kick voltage to first word lines of a first block and apply the second negative kick voltage to word lines of a second block.

In one or more embodiments, the plurality of nonvolatile memory cells are arranged in a plurality of blocks and the one or more control circuits are further configured to apply the first negative kick voltage to first word lines located in an edge region of a block and apply the second negative kick voltage to word lines located in a central region of the block.

In one or more embodiments, the one or more control circuits are further configured to obtain a temperature measurement and to control negative kick voltage according to the temperature measurement including applying the first negative kick voltage for a first temperature measurement and applying the second negative kick voltage for a second temperature measurement.

In one or more embodiments, the one or more control circuits include word line switch circuits connected to the plurality of word lines including first word line switch circuits having first dimensions and second word line switches having second dimensions.

In one or more embodiments, the first word line switches are configured to apply the first negative kick voltage the second word line switches are configured to apply the second negative kick voltage, the second word line switch circuits are smaller than the first word line switch circuits and the second negative kick voltage is less than the first negative kick voltage.

In one or more embodiments, the one or more control circuits are further configured to apply the read voltages in a sequence that includes at least a first voltage ramp down from a first read voltage and a second voltage ramp down from a second read voltage, the different first and second negative kick voltages applied to the first voltage ramp down and not to the second voltage ramp down.

An example method of reading a plurality of nonvolatile memory cells in a memory structure that includes word lines coupled to nonvolatile memory cells includes applying a first read voltage on a first word line; subsequently transitioning voltage on the first word line from the first read voltage to a second read voltage through a first negative kick voltage that is less than the second read voltage; applying the first read voltage on a second word line; and subsequently transitioning voltage on the second word line from the first read voltage to the second read voltage through a second negative kick voltage that is less than the second read voltage.

In one or more embodiments, the method further includes applying the first read voltage on a third word line and subsequently transitioning voltage on the third word line from the first read voltage to the second read voltage without a negative kick voltage such that voltage on the third word line does not transition through any voltage less than the second read voltage.

In one or more embodiments, the method further includes maintaining a record of negative kick voltages to be applied to different word lines including the first word line and the second word line and prior to performing a read operation, obtaining a corresponding negative kick voltage from the record.

In one or more embodiments, the method further includes testing the nonvolatile memory cells to obtain test results; obtaining negative kick voltages to be applied to different word lines from the test results; and storing the obtained negative kick voltages in the record.

In one or more embodiments, the method further includes transitioning voltage on all word lines of a first physical level from the first read voltage to the second read voltage through the first negative kick voltage; and transitioning voltage on all word lines of a second physical level from the first read voltage to the second read voltage through the second negative kick voltage.

In one or more embodiments, the method further includes transitioning voltage on word lines of a first block from the first read voltage to the second read voltage through the first negative kick voltage; and transitioning voltage on word lines of a second block from the first read voltage to the second read voltage through the second negative kick voltage.

In one or more embodiments, the method further includes transitioning voltage on word lines in an edge region of a block from the first read voltage to the second read voltage through the first negative kick voltage; and transitioning voltage on word lines in a central region of the block from the first read voltage to the second read voltage through the second negative kick voltage.

In one or more embodiments, the method further includes obtaining a plurality of temperature measurements; comparing each of the plurality of temperature measurements with a predetermined temperature; selecting the first negative kick voltage in response to obtaining a temperature measurement above the predetermined temperature; and selecting the second negative kick voltage in response to obtaining a temperature measurement below the predetermined temperature.

An example storage system includes a plurality of nonvolatile memory cells connected by word lines; and means for selectively applying negative kick voltages on word lines in ramp downs between read voltages including applying a first negative kick voltage to a first ramp down from a first read voltage to a second read voltage on a first word line, apply a second negative kick voltage to a second ramp down from the first read voltage to the second read voltage on a second word line and apply no negative kick voltage to a third ramp down from the first read voltage to the second read voltage on a third word line.

In one or more embodiments, the plurality of nonvolatile memory cells are located in a memory die; the means for selectively applying negative kick voltages is located on a control die; and the memory die is bonded to the control die to form an integrated memory assembly.

In one or more embodiments, the plurality of nonvolatile memory cells are arranged in a 3D NAND structure that includes a plurality of vertical NAND strings.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a plurality of nonvolatile memory cells, wherein the one or more control circuits are configured to:
   apply read voltages on a plurality of word lines connected to the nonvolatile memory cells, ramp down from the read voltages to subsequent voltages such that voltage on a word line transitions through a voltage that is below a subsequent voltage by a negative kick voltage which is selected according to temperature such that at a first temperature a first negative kick voltage is applied to ramp down from a read voltage on a first word line and at a second temperature a second negative kick voltage is applied to ramp down from the read voltage on the first word line.

2. The apparatus of claim 1, wherein the one or more control circuits are further configured to apply no negative kick voltage on additional word lines such that voltage on an additional word line does not transition the read voltage to a subsequent voltage through any voltage that is below the subsequent voltage.

3. The apparatus of claim 1, wherein the one or more control circuits are further configured to select the negative kick voltage according to location such that the first kick value is applied to ramp down from the read voltage on the first word line and the second negative kick voltage is applied to ramp down from the read voltage on a second word line.

4. The apparatus of claim 1, wherein the plurality of nonvolatile memory cells are arranged in a plurality of blocks and the one or more control circuits are further configured to apply the first negative kick voltage to first word lines of a first block and apply the second negative kick voltage to word lines of a second block.

5. The apparatus of claim 1, wherein the plurality of nonvolatile memory cells are arranged in a plurality of blocks and the one or more control circuits are further configured to apply the first negative kick voltage to first word lines located in an edge region of a block and apply the second negative kick voltage to word lines located in a central region of the block.

6. The apparatus of claim 1, wherein the one or more control circuits are further configured to obtain the first and second temperatures from one or more temperature transducer located in a memory die that includes the plurality of nonvolatile memory cells.

7. The apparatus of claim 1, wherein the one or more control circuits include word line switch circuits connected to the plurality of word lines including first word line switch circuits having first dimensions and second word line switches having second dimensions.

8. The apparatus of claim 7, wherein the first word line switches are configured to apply the first negative kick voltage, the second word line switches are configured to apply the second negative kick voltage, the second word line switch circuits are smaller than the first word line switch circuits and the second negative kick voltage is less than the first negative kick voltage.

9. The apparatus of claim 1, wherein the one or more control circuits are further configured to apply the read voltages in a sequence that includes at least a first voltage ramp down from a first read voltage and a second voltage ramp down from a second read voltage, the different first and second negative kick voltages applied to the first voltage ramp down and not to the second voltage ramp down.

10. A method of reading a plurality of nonvolatile memory cells in a memory structure that includes word lines coupled to nonvolatile memory cells, comprising:
obtaining a first temperature measurement;
selecting a first negative kick voltage in response to the first temperature measurement being above a predetermined temperature;
applying a first read voltage on a first word line;

subsequently transitioning voltage on the first word line from the first read voltage to a second read voltage through a voltage that is less than the second read voltage by the first negative kick voltage;
subsequently, obtaining a second temperature measurement;
selecting a second negative kick voltage in response to the second temperature measurement being below the predetermined temperature;
applying the first read voltage on the first word line; and
subsequently transitioning voltage on the first word line from the first read voltage to the second read voltage through a voltage that is less than the second read voltage by the second negative kick voltage.

11. The method of claim 10, further comprising:
applying the first read voltage on a second word line; and
subsequently transitioning voltage on the second word line from the first read voltage to the second read voltage without a negative kick voltage such that voltage on the second word line does not transition through any voltage less than the second read voltage.

12. The method of claim 10, further comprising:
maintaining a record of negative kick voltages to be applied to different word lines including the first word line and a second word line; and
prior to performing a read operation, obtaining a corresponding negative kick voltage from the record.

13. The method of claim 12, further comprising:
testing the nonvolatile memory cells to obtain test results;
obtaining negative kick voltages to be applied to different word lines from the test results; and
storing the obtained negative kick voltages in the record.

14. The method of claim 10, further comprising:
transitioning voltage on all word lines of a first physical level from the first read voltage to the second read voltage through the first negative kick voltage; and
transitioning voltage on all word lines of a second physical level from the first read voltage to the second read voltage through the second negative kick voltage.

15. The method of claim 10, further comprising:
transitioning voltage on word lines of a first block from the first read voltage to the second read voltage through the first negative kick voltage; and
transitioning voltage on word lines of a second block from the first read voltage to the second read voltage through the second negative kick voltage.

16. The method of claim 12, further comprising:
transitioning voltage on word lines in an edge region of a block from the first read voltage to the second read voltage through the first negative kick voltage; and
transitioning voltage on word lines in a central region of the block from the first read voltage to the second read voltage through the second negative kick voltage.

17. A storage system comprising:
a plurality of nonvolatile memory cells connected by word lines; and
means for selectively applying negative kick voltages on word lines in ramp downs between read voltages including applying a first negative kick voltage to a first ramp down from a first read voltage to a second read voltage on a first word line at a first temperature, applying a second negative kick voltage to a second ramp down from the first read voltage to the second read voltage on the first word line at a second temperature and applying no negative kick voltage to a third ramp down from the first read voltage to the second read voltage on the first word line at a third temperature.

18. The storage system of claim 17 wherein:

the plurality of nonvolatile memory cells are located in a memory die;

the means for selectively applying negative kick voltages is located on a control die; and the memory die is bonded to the control die to form an integrated memory assembly.

19. The storage system of claim 17, wherein the plurality of nonvolatile memory cells are arranged in a 3D NAND structure that includes a plurality of vertical NAND strings.

* * * * *